US007087321B2

(12) United States Patent
Kwong et al.

(10) Patent No.: US 7,087,321 B2
(45) Date of Patent: *Aug. 8, 2006

(54) ORGANIC LIGHT EMITTING DEVICES HAVING REDUCED PIXEL SHRINKAGE

(75) Inventors: Raymond Kwong, Plainsboro, NJ (US); Michael S. Weaver, Princeton, NJ (US); Bin Ma, Monroeville, PA (US); Jui-Yi Tsai, Monroeville, PA (US); Michael Barone, Pittsburgh, PA (US); David B. Knowles, Apollo, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/829,011

(22) Filed: Apr. 21, 2004

(65) Prior Publication Data

US 2004/0241495 A1 Dec. 2, 2004

Related U.S. Application Data

(63) Continuation-in-part of application No. 10/421,074, filed on Apr. 22, 2003.

(51) Int. Cl.
*H01L 51/50* (2006.01)
*H05B 33/12* (2006.01)

(52) U.S. Cl. ............... 428/690; 428/917; 428/201; 313/504; 313/505; 257/88; 257/E51.044; 430/319; 430/321

(58) Field of Classification Search ............... 428/690, 428/917, 201, 209; 313/504, 505; 257/88, 257/89, 90; 546/2, 4, 10
See application file for complete search history.

(56) References Cited

U.S. PATENT DOCUMENTS

| 4,769,292 A | 9/1988 | Tang et al. ............... 428/690 |
| 5,247,190 A | 9/1993 | Friend et al. ................ 257/40 |
| 5,703,436 A | 12/1997 | Forrest et al. .............. 313/506 |
| 5,707,745 A | 1/1998 | Forrest et al. .............. 428/432 |
| 5,834,893 A | 11/1998 | Bulovic et al. ............. 313/506 |
| 5,844,363 A | 12/1998 | Gu et al. .................... 313/506 |
| 6,013,982 A | 1/2000 | Thompson et al. ......... 313/506 |
| 6,087,196 A | 7/2000 | Sturm et al. .................. 438/29 |
| 6,091,195 A | 7/2000 | Forrest et al. .............. 313/504 |
| 6,097,147 A | 8/2000 | Baldo et al. ................ 313/506 |
| 6,294,398 B1 | 9/2001 | Kim et al. ..................... 438/22 |
| 6,303,238 B1 | 10/2001 | Thompson et al. ......... 428/690 |
| 6,310,360 B1 | 10/2001 | Forrest et al. ................ 257/40 |
| 6,337,102 B1 | 1/2002 | Forrest et al. ............... 427/64 |
| 6,468,819 B1 | 10/2002 | Kim et al. ..................... 438/22 |
| 6,548,956 B1 | 4/2003 | Forrest et al. .............. 313/504 |
| 6,822,629 B1 * | 11/2004 | Yamazaki et al. ............ 345/76 |
| 6,835,469 B1 * | 12/2004 | Kwong et al. .............. 428/690 |
| 2001/0019782 A1 * | 9/2001 | Igarashi et al. ............. 428/690 |
| 2002/0034656 A1 | 3/2002 | Thompson et al. ......... 428/690 |
| 2002/0121638 A1 * | 9/2002 | Grushin et al. ............... 257/40 |
| 2002/0127478 A1 | 9/2002 | Weaver et al. ................ 430/5 |
| 2002/0182441 A1 | 12/2002 | Lamansky et al. .......... 428/690 |
| 2003/0030370 A1 * | 2/2003 | Tada .......................... 313/504 |
| 2003/0068526 A1 * | 4/2003 | Kamatani et al. ........... 428/690 |
| 2003/0068536 A1 * | 4/2003 | Tsuboyama et al. ........ 428/704 |
| 2003/0072964 A1 | 4/2003 | Kwong et al. .............. 428/690 |
| 2003/0230980 A1 | 12/2003 | Forrest et al. .............. 313/600 |
| 2004/0086743 A1 * | 5/2004 | Brown et al. ............... 428/690 |
| 2004/0094768 A1 * | 5/2004 | Yu et al. ....................... 257/79 |
| 2004/0174116 A1 | 9/2004 | Lu et al. ..................... 313/506 |

FOREIGN PATENT DOCUMENTS

| WO | WO 02/02714 A2 * | 1/2002 |
| WO | WO 02/074015 | 9/2002 |

OTHER PUBLICATIONS

Baldo et al., "Highly Efficient Phosphorescent Emission from Organic Electroluminescent Devices," Nature, vol. 395, pp. 151-154, Sep. 1998.

Baldo et al., "Very High-Efficiency Green Organic Light-Emitting Devices Based On Electrophosphorescence," Appl. Phys. Lett., vol. 75, No. 1, 4-6, Jul. 1999.

Adachi et al., "Nearly 100% Internal Phosphorescence Efficiency in an Organic Light Emitting Device," J. Appl. Phys., vol. 90, pp. 5048-5051, Nov. 2001.

* cited by examiner

*Primary Examiner*—Marie Yamnitzky

(57) ABSTRACT

The present invention relates to organic light emitting devices (OLEDs), and more specifically to efficient OLEDs comprising an array of pixels and having reduced pixel shrinkage. The devices of the present invention comprise further relates to materials for use as emissive materials which give reduced shrinkage when incorporated into an OLED.

3 Claims, 6 Drawing Sheets

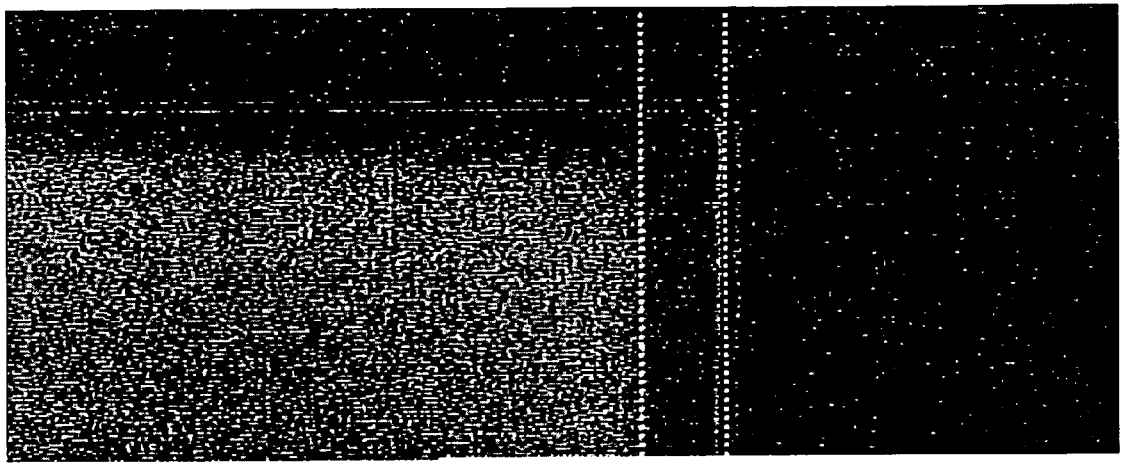
FIGURE 4A – PRIOR ART
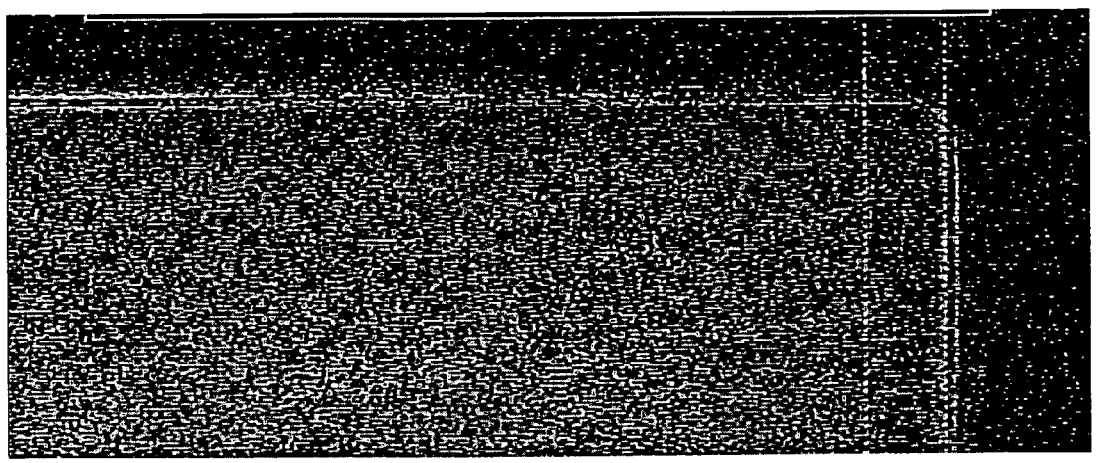
FIGURE 4B

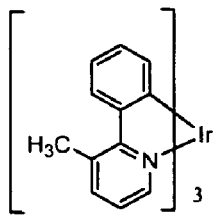
Ir(3-Meppy)₃
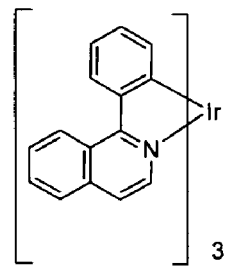
Ir(1-piq)₃
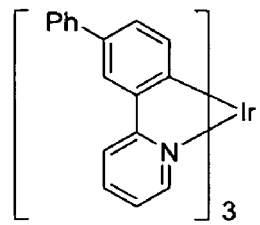
Ir(5-Phppy)₃
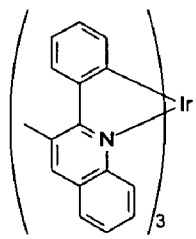
Ir(3-Mepq)₃
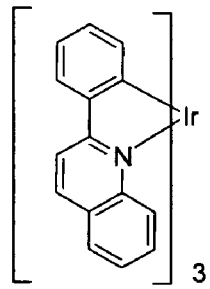
Ir(pq)₃
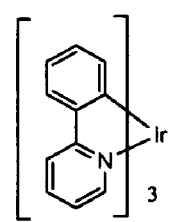
Ir(ppy)₃
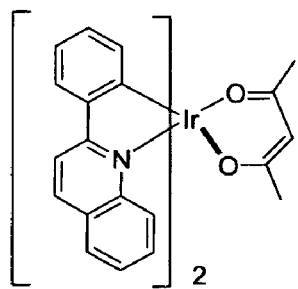
Ir(pq)₂(acac)
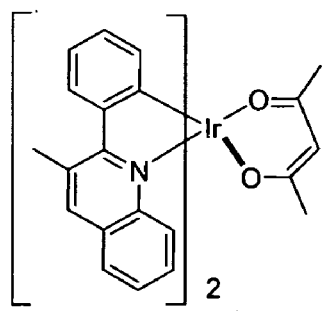
Ir(3-Mepq)₂(acac)
FIGURE 5

ORGANIC LIGHT EMITTING DEVICES HAVING REDUCED PIXEL SHRINKAGE

REFERENCE TO RELATED APPLICATION

This application is a continuation-in-part of U.S. patent application Ser. No. 10/421,074, filed Apr. 22, 2003, which is incorporated in its entirety herein.

FIELD OF THE INVENTION

The present invention relates to organic light emitting devices (OLEDs), and more specifically to efficient OLEDs comprising an array of pixels and having reduced pixel shrinkage. The present invention further relates to materials for use as emissive materials which give reduced shrinkage when incorporated into an OLED.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices, organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such as used in a top-emitting device, as disclosed in U.S. Pat. Nos. 5,703,436, 5,707,745 and 6,548,956, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

SUMMARY OF THE INVENTION

An organic light emitting device having an emissive layer disposed between and electrically connected to an anode and a cathode is provided. The devices of the present invention comprise an array of pixels, wherein each pixel comprises an emissive layer comprising a phosphorescent emissive material, and wherein the pixel shrinkage is less than about 10% area when operated at about 10 mA/cm$^2$ constant dc current in at least 1000 hours at room temperature. Alternatively, the pixel shrinkage is less than about 10 μm shrinkage when operated at about 10 mA/cm$^2$ constant dc current in 1000 hours at room temperature, and preferably, the pixel shrinkage is less than about 5 μm shrinkage when operated at about 10 mA/cm$^2$ constant dc current in 1000 hours at room temperature.

The present invention also provides materials for use as the phosphorescent emissive material in the organic light emitting devices. In one embodiment, the phosphorescent emissive material is selected from a compound of the formula VII

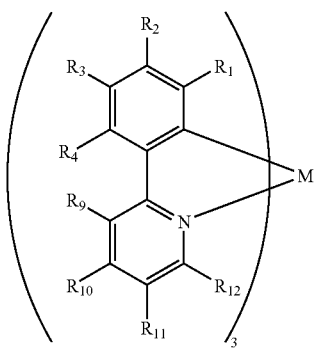

VII

M is a metal atom;

each $R^1$, $R^2$, $R^3$, $R^4$, $R^9$, $R^{10}$, $R^{11}$, and $R^{12}$ is, independently, H, F, Cl, Br, I, R, OR, $N(R)_2$, SR, C(O)R, C(O)OR, $C(O)N(R)_2$, CN, $NO_2$, $SO_2$, SOR, $SO_2R$, $SO_3R$; and additionally, or alternatively, any one or more of $R^1$ and $R^2$, or $R^2$ and $R^3$, or $R^3$ and $R^4$, or $R^9$ and $R^{10}$, or $R^{10}$ and $R^{11}$, or $R^{11}$ and $R^{12}$, together form, independently, a fused 4- to 7-member cyclic group, wherein said cyclic group is cycloalkyl, cycloheteroalkyl, aryl, or heteroaryl, and wherein said cyclic group is optionally substituted by one or more substituents X;

each R is, independently, H, $C_{1-C20}$ alkyl, $C_2$–$C_{20}$ alkenyl, $C_2$–$C_{20}$ alkynyl, $C_1$–$C_{20}$ heteroalkyl, $C_5$–$C_{40}$ aryl, $C_5$–$C_{40}$ heteroaryl, aralkyl; wherein R is optionally substituted by one or more substituents X;

each X is, independently, H, F, Cl, Br, I, R', O R', $N(R')_2$, SR', C(O)R', C(O)OR', $C(O)N(R')_2$, CN, $NO_2$, $SO_2$, SOR', $SO_2R'$, or $SO_3R'$;

each R' is, independently, H, $C_1$–$C_{20}$ alkyl, $C_1$–$C_{20}$ perhaloalkyl $C_2$–$C_{20}$ alkenyl, $C_2$–$C_{20}$ alkynyl, $C_1$–$C_{20}$ heteroalkyl, $C_5$–$C_{40}$ aryl, or $C_5$–$C_{40}$ heteroaryl; and wherein at least one of $R^1$, $R^2$, $R^3$, $R^4$, $R^9$, $R^{10}$, $R^{11}$, and $R^{12}$ is not H.

BRIEF DESCRIPTION OF THE DRAWINGS

FIG. 4A shows photo results of pixel fill conditions (magnification ×50) for device doped with the compound of Comparative Example A [$Ir(3Mepq)_2(acac)$] under conditions of 40 $mA/cm^2$ dc current at room temperature after 300 hours.

FIG. 4B shows photo results of pixel fill conditions (magnification ×50) for device doped with $Ir(1-piq)_3$ under conditions of 40 $mA/cm^2$ dc current at room temperature after 1000 hours.

FIG. 5 shows the chemical structures of $Ir(3-Meppy)_3$, $Ir(1-pi)_3$, $Ir(5-Phppy)_3$ $Ir(3-Mepq)_3$, $Ir(pq)_3$, $Ir(ppy)_3$, $Ir(Pq)_2(acac)$ and $Ir(3-Mepq)_2(acac)$.

DETAILED DESCRIPTION

Figure 1:
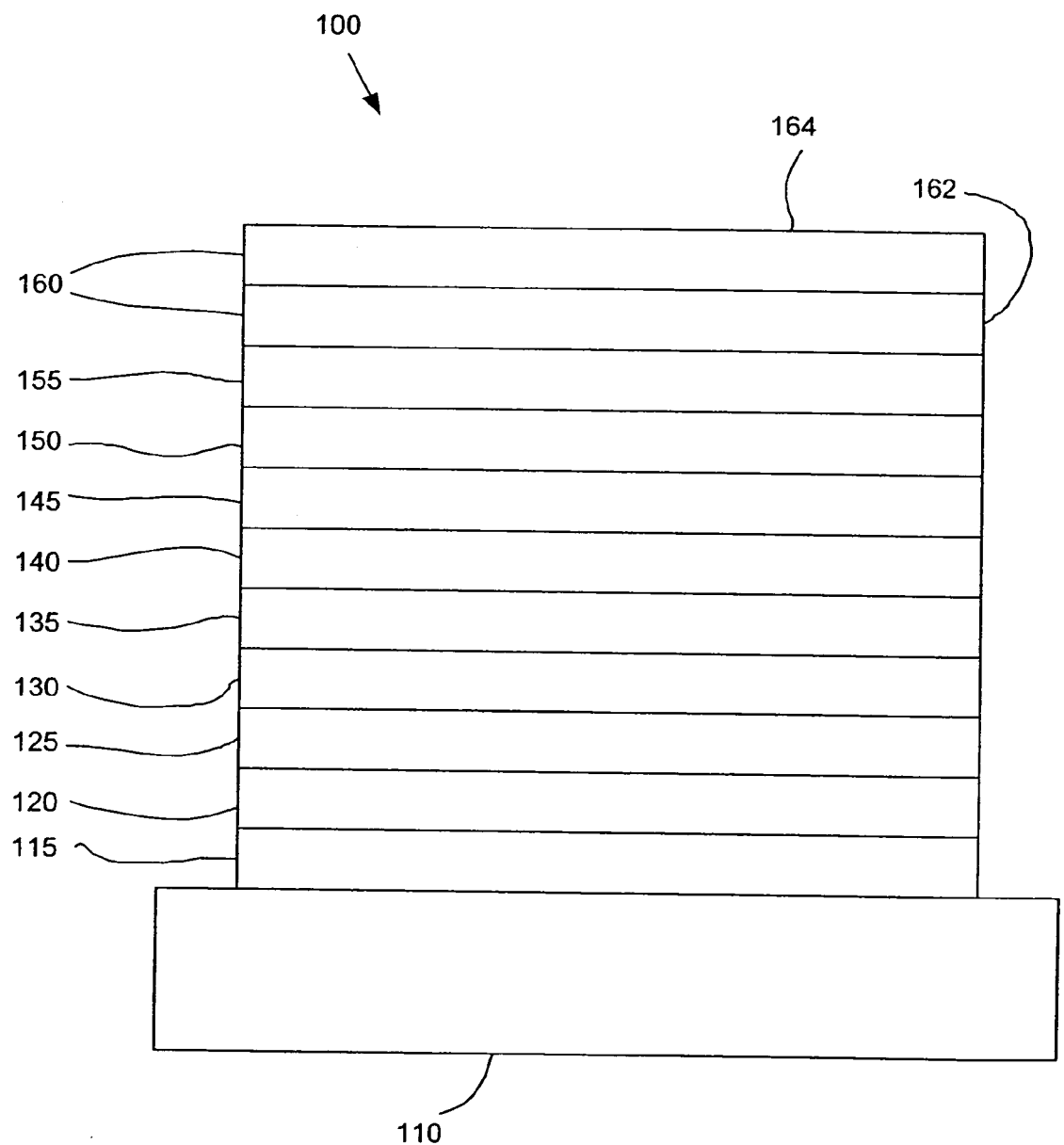
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated as in Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 3, 4–6 (1999) ("Baldo-II"), which are incorporated by reference in their entireties. Phosphorescence may be referred to as a "forbidden" transition because the transition requires a change in spin states, and quantum mechanics indicates that such a transition is riot favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature. Representative emissive layers include doped or un-doped phosphorescent organo-metallic materials such as disclosed in U.S. Pat. Nos. 6,303,238 and 6,310,360; U.S. patent application Publication Nos. 2002-0034656; 2002-0182441; and 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No.5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 125 may be intrinsic (undoped), or doped. Doping may be used to enhance conductivity. 4,4'-Bis[N-(1-naphthyl)-N-phenylamino]biphenyl ($\alpha$-NPD) and as N,N'-diphenyl-N,N'-bis(3-methylphenyl)1-1'biphenyl-4,4'diamine (TPD) are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of phosphorescent emissive materials and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

A class of phosphorescent emissive materials includes cyclometallated complexes of the formula

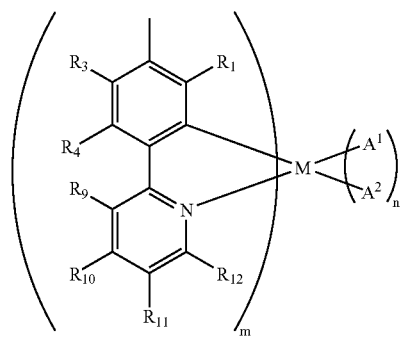

wherein:

M is a metal atom;

each $A^1$ and $A^2$ is, independently, a monodentate ligand; or $A^1$ and $A^2$ are covalently joined together to form a bidentate ligand;

each $R^1$, $R^2$, $R^3$, $R^4$, $R^9$, $R^{10}$, $R^{11}$, and $R^{12}$ is, independently, H, F, Cl, Br, I, R, OR, $N(R)_2$, SR, C(O)R, C(O)OR, $C(O)N(R)_2$, CN, $NO_2$, $SO_2$, SOR, $SO_2R$, $SO_3R$; and additionally, or alternatively, any one or more of $R^1$ and $R^2$, or $R^2$ and $R^3$, or $R^3$ and $R^4$, or $R^9$ and $R^{10}$, or $R^{10}$ and $R^{11}$, or $R^{11}$ and $R^{12}$, together form, independently, a fused 4- to 7-member cyclic group, wherein said cyclic group is cycloalkyl, cycloheteroalkyl, aryl, or heteroaryl, and wherein said cyclic group is optionally substituted by one or more substituents X;

each R is, independently, H, $C_1$–$C_{20}$ alkyl, $C_2$–$C_{20}$ alkenyl, $C_2$–$C_{20}$ alkynyl, $C_1$–$C_{20}$ heteroalkyl, $C_5$–$C_{40}$ aryl, $C_5$–$C_{40}$ heteroaryl, aralkyl; wherein R is optionally substituted by one or more substituents X;

each X is, independently, H, F, Cl, Br, I, R', OR', $N(R')_2$, SR', C(O)R', C(O)OR', $C(O)N(R')_2$, CN, $NO_2$, $SO_2$, SOR', $SO_2R'$, or $SO_3R'$;

each R' is, independently, H, $C_1$–$C_{20}$ alkyl, $C_1$–$C_{20}$ perhaloalkyl $C_2$–$C_{20}$ alkenyl, $C_2$–$C_{20}$ alkynyl, $C_1$–$C_{20}$ heteroalkyl, $C_5$–$C_{40}$ aryl, or $C_5$–$C_{40}$ heteroaryl;

m=1,2, or 3; and n=0, 1,or2;

wherein m+n=3.

In one embodiment of the invention, $A^1$ and $A^2$ are each a monodentate ligand. Monodentate ligands $A^1$ and $A^2$ can include any ligand capable of coordinating to a metal atom through one atom. Numerous monodentate ligands are known to those skilled in the art and many suitable examples are provided in Cotton and Wilkinson, *Advanced Inorganic Chemistry*, Fourth Ed., John Wiley & Sons, New York, 1980, which is incorporated herein by reference in its entirety. In some embodiments, the monodentate ligands can include F, Cl, Br, I, CO, CN, CN(R), $SR^{11}$ SCN, OCN, $P(R^{11})_3$, $P(OR^{11})_3$, $N(R^{11})_3$, NO, $N_3$, or a nitrogen-containing heterocycle optionally substituted by one or more substituents. The phrase "nitrogen-containing heterocycle," as used herein refers to any heterocyclic group containing at least one nitrogen atom. Nitrogen-containing heterocycles can be saturated or unsaturated and include pyridine, imidazole, pyrrolidine, piperidine, morpholine, pyrimidine, pyrazine, pyridazine, pyrrole, 1,3,4-triazole, teterzole, isoxazole, thizole, derivatives thereof and the like. In further embodiments, one of $A^1$ and $A^2$ is a neutral monodentate ligand and the other of $A^1$ and $A^2$ is monoanionic, i.e., $A^1$ and $A^2$ have a combined charge of (−1). For example, $A^1$ can be chloro and $A^2$ can be pyridyl.

In another embodiment, $A^1$ and $A^2$ together represent a bidentate ligand. Numerous bidentate ligands are known to those skilled in the art and many suitable examples are provided in Cotton and Wilkinson. In some embodiments, bidentate ligands are monoanionic. Suitable bidentate ligands include acetylacetonate (acac), picolinate (pic), salicylidene, amino acids, salicylaldehydes, and iminoacetonates, and derivatives thereof. Suitable bidentate ligands include acetylacetonate (acac) and picolinate (pic), and derivatives thereof and have the following structures:

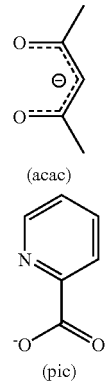

(acac)

(pic)

wherein the acac or the pic may be substituted at one or more of the carbon atoms with one or more of alkyl, alkenyl, alkynyl, aralkyl, CN, $CF_3$, $CO_2R$, C(O)R, $NR_2$, $NO_2$, OR, halo, aryl, and heteroaryl.

Electron transport layer 140 may include a material capable of transporting electrons. Electron transport layer 140 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. In this case, the "charge carrying component" is the material responsible for the LUMO that actually transports electrons. This component may be the base material, or it may be a dopant. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and doped metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to inhibit electrons from leaving emissive layer 135 in the direction of hole transport layer 125. Similarly, a hole blocking layer 140 may be disposed between emissive layer 135 and electron transport layer 145, to inhibit holes from leaving emissive layer 135 in the direction of electron transport layer 140. Blocking layers may also be used to inhibit excitons from diffusing out of the emissive layer. The theory and use of blocking layers is described in more detail in U.S. Pat. No. 6,097,147 and U.S. patent application Ser. No. 10/173,682 to Forrest et al., which are incorporated by reference in their entireties. Blocking layers can serve one or more blocking functions. For example, a hole blocking layer can also serve as an exciton blocking layer. In some embodiments, the hole blocking layer does not simultaneously serve as an emissive layer in devices of the present invention. Although a blocking layer can include compounds that are capable of emitting, emission can occur in a separate emissive layer. Thus, in preferred embodiments, the blocking layer does not luminesce. Blocking layers can be thinner than carrier layers. Typical blocking layers have a thickness ranging from about 50 Å.

Devices of the present invention may comprise an electron blocking layer. An electron blocking layers functions to confine electrons to specific regions of the light emitting devices. For example, device efficiency can be increased if electrons are inhibited from migrating out of the emissive layer (EL). Electron blocking layers are comprised of materials that have difficulty acquiring electrons (i.e., are relatively difficult to reduce). In the context of a light emitting device, electron blocking layers are preferably more difficult to reduce than the adjacent layer from which electrons migrate. A material that is more difficult to reduce than another material generally has a higher LUMO energy level. As an example, electrons originating from the cathode and migrating into an EL layer can be blocked from exiting the EL (on the anode side) by placing a blocking layer adjacent to the anode side of the EL where the blocking layer has a LUMO energy level higher than the LUMO energy level of the EL. Larger differences in LUMO energy levels correspond to better electron blocking ability. The LUMO of the materials of the blocking layer are preferably at least about 300 meV, or more, above the LUMO level of an adjacent layer in which holes are to be confined. In some embodiments, the LUMO of the materials of the blocking layer can be at least about 200 meV above the LUMO level of an adjacent layer in which holes are to be confined.

In some embodiments, the layer in which electrons are to be confined can comprise more than one material, such as a host material (matrix) and a dopant. In this case, an electron blocking layer preferably has a LUMO energy level that is higher than the material of the adjacent layer which carries the majority of negative charge (e.g., either the host or dopant having the lowest LUMO energy level). For example, an emissive layer can include a host material having a deeper LUMO energy level than the dopant. In this case, the host can be the principle electron transporter of the emissive layer. In such embodiments, the LUMO energy level of the electron blocking layer can be higher than the host material and lower than that of the dopant. Similarly, if the dopant served as the primary carrier of electrons, then the electron blocking layer preferably has a higher LUMO than the dopant.

Electron blocking layers are also preferably good hole injectors. Accordingly, the HOMO energy level of the electron blocking layer is preferably close to the HOMO energy level of the layer in which electrons are to be confined. It is preferable that differences in HOMO energy levels between the two layers is less than the differences in LUMO energies, leading to a lower barrier for migration of holes across the interface than for the migration of electrons form the emissive layer into the electron blocking layer. Electron blocking layers that are also good hole injectors typically have smaller energy barriers to hole injection than for electron leakage. Accordingly, the difference between the HOMO energies of the electron blocking layer and the layer in which electrons are to be confined (corresponding to an hole injection energy barrier) is smaller than the difference in their LUMO energies (i.e., electron blocking energy barrier).

As would be generally understood by one skilled in the art, use of the term "blocking" layer is meant to suggest that the layer is comprised of a material, or materials, that provide a barrier that significantly inhibits transport of charge carriers and/or excitons through the layer, without in any sense suggesting or implying that the barrier completely blocks all charge carriers and/or excitons. The presence of such a barrier typically manifests itself in terms of producing substantially higher efficiencies as compared to devices lacking the blocking layer, and/or in terms of confining the emission to the desired region of the OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. In this case, the "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
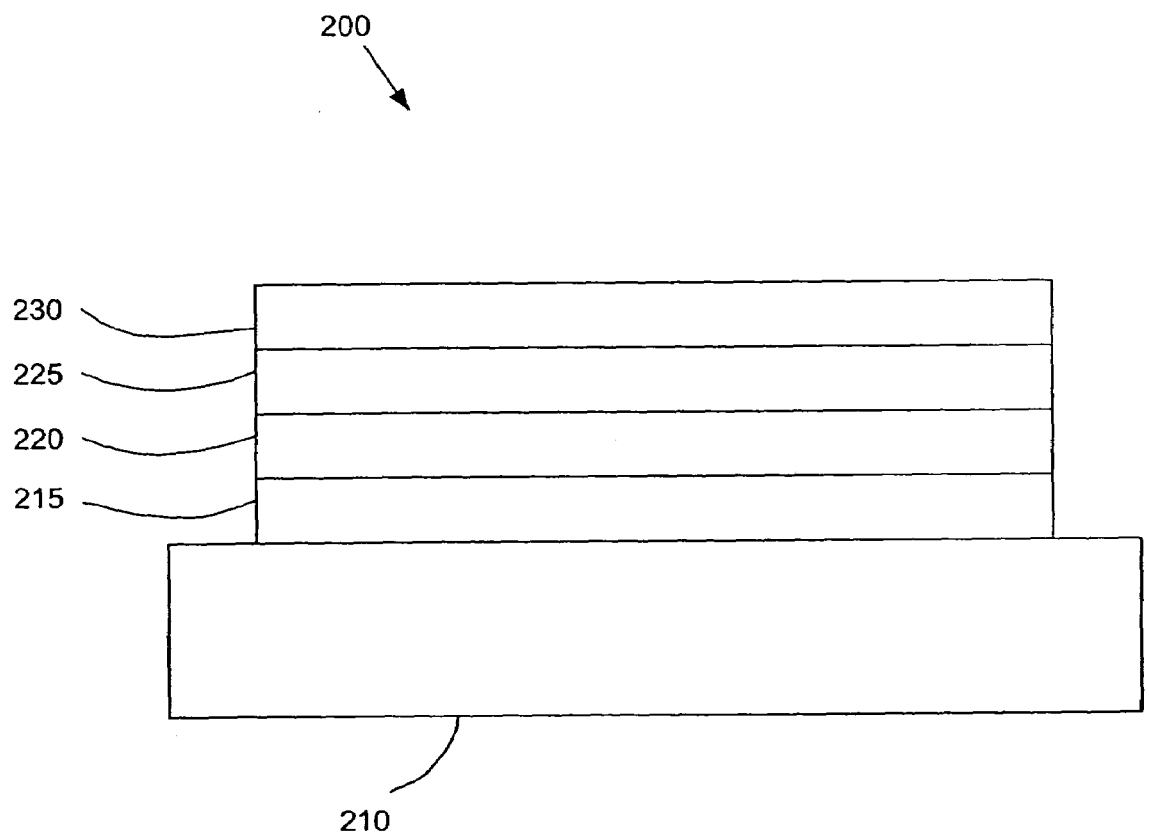
FIG. 2 shows an inverted organic light emitting device that does not have a separate electron transport layer.
Figure 3:
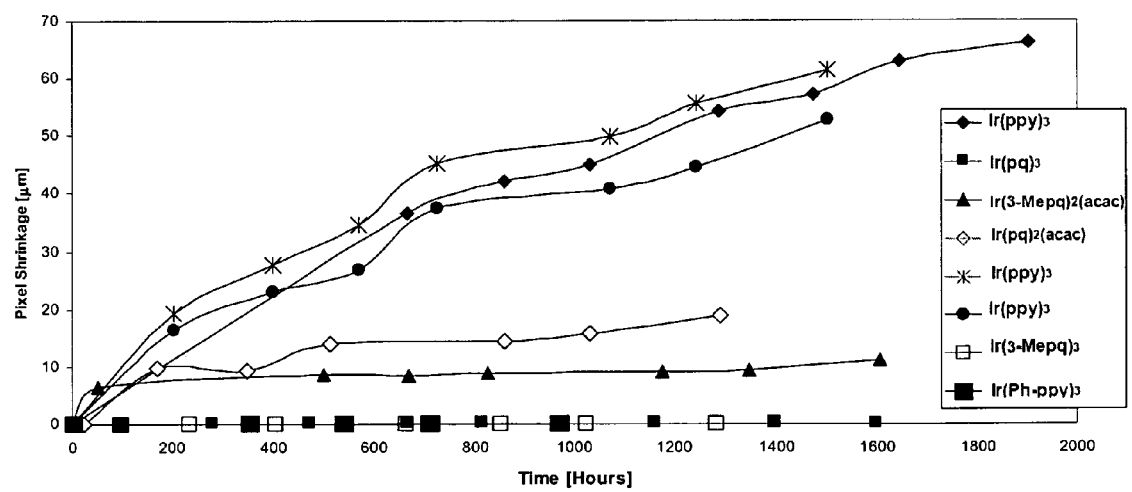
FIG. 3 shows the plot of pixel shrinkage vs. time for various devices having a polyimide photo-resist grid used to define pixel dimensions of 0.01 $mm^2$ to 5 $mm^2$ under conditions of 10 $mA/cm^2$ dc current at room temperature. Compounds tested and shown in FIG. 3 were $Ir(3-Mepq)_3$, $Ir(pq)_3$, $Ir(5-Phppy)_3$, $Ir(3-Mepq)_2(acac)$, $Ir(pq)_2(acac)$, and $Ir(ppy)_3$.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C to 30 degrees C, and more preferably at room temperature (20–25 degrees C).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Pixel shrinkage is a serious concern in OLED displays. The pixel active area is often defined by an organic (such as photoresist) or inorganic (such as silicon nitride) grid on the electrode (anode or cathode) on the substrate, wherein the grid has an opening which is the active area. In addition to defining the pixels, a grid may act to cover additional components on the substrate, e.g., thin film transistors (TFTs), that may be used to drive the OLEDs in an active matrix (AM) display. However, OLED materials may have undesirable reactions with the grid material itself, impurities therein, or other external agents. This can cause degradations of the OLED materials, during operation if the reactions are facilitated by electric current, or not during operation if the reactions are purely chemical, or both. The shrinkage rate may also be affected by the operating or storage temperature of the devices. The luminescent material is especially susceptible to such degradations because the efficiency of luminescence is very sensitive to impurities which may form during the degradations. If the luminescent materials are degraded by interacting with the grid or impurities from the grid, the degradation will start from the edge of the pixel which is in contact with the grid. The result is a loss of luminance at the edges of the pixel when compared to the central area of the pixel that is not yet affected. As the grid material typically surrounds a pixel, the effect is seen as the occurrence of a dimmer perimeter of the pixel. The visual effect is as if the pixel has shrunk. Thus, the term pixel shrinkage refers to a reduction in the observed emissive area of a pixel. The shrinkage may be defined as the width of the dim area which extends inward from the edge of the pixel (measured perpendicular from the pixel edge to the region of uniform brightness) and can be examined and measured using an optical microscope. Alternatively, the shrinkage may be expressed as a % area of the pixel that has been affected by the shrinkage.

In some displays, such as those that are passive matrix (PM) addressed, an integrated shadow mask (ISM) is also present on the substrate in addition to a grid material. An ISM is an element that may be used to define the patterning of the top electrode (usually the cathode) in an OLED PM display, as disclosed in U.S. application Publication No. US 2002/0127478, which is incorporated herein in its entirety. The ISM may be made of similar materials as those discussed with respect to the grid. The ISM feature is usually large (usually >0.5 μm) with respect to the OLED and grid material. As such it may also contain elements that may outgas and be deleterious to the OLED. This may be observed as an increased degree of shrinkage on the sides of the pixels parallel to the ISM.

In some cases the dimmer or shrunken pixel region has a non-uniform brightness. It often appears as a gradient in emission intensity appearing darker at the outer edge of the pixel in contact with the grid and gradually becoming brighter nearer to the center of the pixel or to the uniform-intensity (non-shrunken) region of the pixel. To overcome the problem of pixel shrinkage, it is important to design a class of materials which is more robust and less sensitive to undesirable interactions which may lead to pixel shrinkage.

The normal test coupon size is usually of the order of several $mm^2$ (usually at least >1 $mm^2$). Therefore, many measurements for the evaluation of organic light emitting devices are insensitive to any shrinkage, i.e. JVL, spectral measurements and lifetime. All of these measurements are relatively insensitive to shrinkage, as the amount of shrinkage (a few μm) is extremely small in comparison to the active pixel dimensions (for example, 2.24×2.24 mm). Thus, a 10 μm shrinkage would represent a loss in active area of less than 2% for a 2.24×2.24 mm pixel. Additionally, the measurements are usually performed within the first few hours after device fabrication. The device is usually not electrically driven prior to this testing. Therefore, the fact that the degree of shrinkage is time dependent and that the test pixel area is large compared to the shrunken area means that the observation of this phenomenon was first made when the dimensions of a pixel were small, i.e. in a relatively high resolution display. The magnitude of shrinkage in absolute area is believed to be relatively independent of device area. As a result, shrinkage is much more significant for smaller pixel sizes in terms of the percentage of the pixel area that is affected and the overall light intensity from the pixel. For example, in a 60 dpi monochrome display, the pixel pitch is about 418 μm (assuming about 5 to 10 μm spacing between pixels based on the shadow masking or ink jet printing resolution currently available). A pixel shrinkage of 10 μm would represent a loss in area of ~10%. Even for this resolution of display, this loss of area would be unacceptable for the lifetime of the device. Higher resolution devices and color devices are more severely affected by the effects of pixel shrinkage. For example, assuming at best a 5 μm pixel spacing:

- a 60 dpi full color display with 136×136 μm sub pixels, with >10 μm of shrinkage would represent a loss in pixel area of >27%;
- a 80 dpi full color display with 101×101 μm sub pixels, with >10 μm of shrinkage would represent a loss in pixel area of >36%;
- a 100 dpi full color display with 80×80 μm sub pixels, with >10 μm of shrinkage would represent a loss in pixel area of >44%;
- a 150 dpi full color display with 51×51 μm sub pixels, with >10 μm of shrinkage would represent a loss in pixel area of >63%;

a 200 dpi full color display with 37×37 µm sub pixels, with >10 µm of shrinkage would represent a loss in pixel area of >79%;

Thus, for devices having a 500 µm or less pixel pitch it is particularly important to ensure that shrinkage is prevented.

Pixel shrinkage has been observed in pixels in the presence of a photoresist grid, for example a polyimide photoresist grid (e.g. DLDC1000 available from Dow Corning) or negative photoresist grid (e.g. NR7-250PY or NR7-600PY available from Futurrex Inc.). Although shrinkage may occur in devices without a grid, the presence of the photoresist grid significantly increase the rate of pixel shrinkage. Additionally, shrinkage rate has been found generally to be independent of pixel active area or shape. Typically, the shrinkage rate is current density dependent and can also be temperature dependent.

The devices of the present invention are OLEDs having reduced pixel shrinkage comprising an array of pixels. The amount of pixel shrinkage may be expressed as a % area of the pixel that has been affected by the shrinkage. Thus, the devices of the present invention show a pixel shrinkage of less than about 20% area shrinkage at about 1 mA/cm$^2$ constant dc current in 1000 hrs at room temperature. Preferably, the devices show a pixel shrinkage of less than about 10% area shrinkage at about 1 mA/cm$^2$ constant dc current in at least 1000 hrs at room temperature. More preferably, the devices show a pixel shrinkage of less than about 5% area shrinkage at about 1 mA/cm$^2$ constant dc current in at least 1000 hrs at room temperature. Still more preferably, the devices show a pixel shrinkage of less than about 1% area shrinkage at about 1 mA/cm$^2$ constant dc current in at least 1000hrs at room temperature.

In a further embodiment, the devices of the present invention show a pixel shrinkage of less than about 20% area shrinkage at about 5 mA/cm$^2$ constant dc current in at least 1000 hrs at room temperature. Preferably, the devices show a pixel shrinkage of less than about 10% area shrinkage at about 5 mA/cm$^2$ constant dc current in at least 1000 hrs at room temperature. More preferably, the devices show a pixel shrinkage of less than about 5% area shrinkage at about 5 mA/cm$^2$ constant dc current in at least 1000 hrs at room temperature. Still more preferably, the devices show a pixel shrinkage of less than about 1% area shrinkage at about 5 mA/cm$^2$ constant dc current in at least 1000 hrs at room temperature.

In a further embodiment, the devices of the present invention show a pixel shrinkage of less than about 20% area shrinkage at about 10 mA/cm$^2$ constant dc current in at least 1000 hrs at room temperature. Preferably, the devices show a pixel shrinkage of less than about 10% area shrinkage at about 10 mA/cm$^2$ constant dc current in at least 1000 hrs at room temperature. More preferably, the devices show a pixel shrinkage of less than about 5% area shrinkage at about 10 mA/cm$^2$ constant dc current in at least 1000 hrs at ambient temperature. Still more preferably, the devices show a pixel shrinkage of less than about 1% area shrinkage at about 10 mA/cm$^2$ constant dc current in at least 1000 hrs at room temperature.

Alternatively, the amount of pixel shrinkage may be expressed as the width of the dim area which extends inward from the edge of the pixel (measured perpendicular to the device edge to the area of uniform luminescence). Thus, in a further embodiment, the devices of the present invention show a pixel shrinkage of less than about 15 µm shrinkage at about 1 mA/cm$^2$ constant dc current in 1000 hrs at room temperature. Preferably, the devices show a pixel shrinkage of less than about 10 µm shrinkage at about 1 mA/cm$^2$ constant dc current in 1000 hrs at room temperature. More preferably, the devices show a pixel shrinkage of less than about 5 µm shrinkage at about 1 mA/cm$^2$ constant dc current in 1000 hrs at room temperature. Still more preferably, the devices show a pixel shrinkage of less than about 2 µm shrinkage at about 1 mA/cm$^2$ constant dc current in 1000 hrs at room temperature.

In a further embodiment, the devices of the present invention show a pixel shrinkage of less than about 15 µm shrinkage at about 5 mA/cm$^2$ constant dc current in 1000 hrs at room temperature. Preferably, the devices show a pixel shrinkage of less than about 10 µm shrinkage at about 5 mA/cm$^2$ constant dc current in 1000 hrs at room temperature. More preferably, the devices show a pixel shrinkage of less than about 5 µm shrinkage at about 5 mA/cm$^2$ constant dc current in 1000 hrs at room temperature. Still more preferably, the devices show a pixel shrinkage of less than about 2 µm shrinkage at about 5 mA/cm$^2$ constant dc current in 1000 hrs at room temperature.

In a further embodiment, the devices of the present invention show a pixel shrinkage of less than about 15 µm shrinkage at about 10 mA/cm$^2$ constant dc current in 1000 hrs at room temperature. Preferably, the devices show a pixel shrinkage of less than about 10 µm shrinkage at about 10 mA/cm$^2$ constant dc current in 1000 hrs at room temperature. More preferably, the devices show a pixel shrinkage of less than about 5 µm shrinkage at about 10 mA/cm$^2$ constant dc current in 1000 hrs at room temperature. Still more preferably, the devices show a pixel shrinkage of less than about 2 µm shrinkage at about 10 mA/cm$^2$ constant dc current in 1000 hrs at room temperature.

The term room temperature as used herein refers to the ambient temperature and is generally taken to be about 18° C. to about 25° C., and preferably about 20° C. Although the ambient temperature may be room temperature, the temperature of the device during operation may be higher.

In comparing emissive compounds based on the general formula $ML_3$ and $ML_2(A^1–A^2)$, where L is an cyclometallated ligand, M is a metal and $A^1–A^2$ represents mono- or bidentate ligands defined above for $A^1$ and $A^2$, the $ML_3$ compounds generally have a significant advantage in terms of a reduction in pixel shrinkage. When incorporated into an organic light emitting device comprising a grid of pixels, the emissive materials in the form of $ML_3$, instead of $ML_2(A^1–A^2)$, are less sensitive to pixel shrinkage. Without being limited by theory, it is believed that this effect is a result of the metal-ligand bond between the metal and $(A^1–A^2)$ being more labile than the M-L bond, even in the case where both the L and $(A^1–A^2)$ ligands may be bi-dendate. The $(A^1–A^2)$ ligand is labile, meaning that it can be displaced easily, resulting in chemical change which leads to reduced luminescence efficiency. The L ligand by definition is bidentate because it is cyclometallating. On the other hand, the $(A^1–A^2)$ ligand may not necessarily be bidentate in nature. If $(A^1–A^2)$ is two mono-dentate ligands, the pixel shrinkage generally will be more severe. Therefore, the $ML_3$ class offers a significant advantage over $ML_2(A^1–A^2)$ class as phosphorescent emissive materials.

The invention provides an organic light emitting device having an emissive layer with reduced pixel shrinkage comprising an emissive material, wherein the emissive material can be represented by the general formula $ML_3$. The bidentate cyclometallating ligand, L, is preferably selected so that L is not labile. As seen in Comparative Example 3, the unsubstituted phenylpyridine (ppy) ligand of the emissive compound Ir(ppy)$_3$ may be too labile, so that the pixels having Ir(ppy)$_3$ as the emissive material suffer from pixel shrinkage. Thus, in a preferred embodiment, the invention provides an emissive material comprising a substituted phenylpyridine ligand. The substituents for the phenylpyridine ligands are selected so that the ligand is less labile, for example, in comparison to the unsubstituted phenylpyridine. In one embodiment, the substituted phenylpyridine ligands have substituents selected to increase the steric bulkiness and/or the molecular weight of the ligand. Without being limited by theory, it is believed that ligands with increased steric bulkiness and increased molecular weight are less likely to undergo the associative type of substitution (SN2). The associative type of substitution requires the complex to re-orient to adopt a geometry favorable for the attack by the external agent. If the ligand has sufficient steric bulkiness and/or molecular weight, it is more difficult to move around to adopt such a geometry.

Thus, in a preferred embodiment of the present invention, the organic light emitting device comprises a grid of pixels, and each pixel has an emissive layer comprising an emissive material of the formula VII

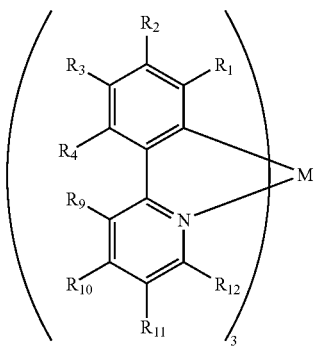

VII wherein:

M is a metal atom;

each $R^1$, $R^2$, $R^3$, $R^4$, $R^9$, $R^{10}$, $R^{11}$, and $R^{12}$ is, independently, H, F, Cl, Br, I, R, OR, N(R)$_2$, SR, C(O)R, C(O)OR, C(O)N(R)$_2$, CN, NO$_2$, SO$_2$, SOR, SO$_2$R, SO$_3$R; and additionally, or alternatively, any one or more of $R^1$ and $R^2$, or $R^2$ and $R^3$, or $R^3$ and $R^4$, or $R^9$ and $R^{10}$, or $R^{10}$ and $R^{11}$, or $R^{11}$ and $R^{12}$, together form, independently, a fused 4- to 7-member cyclic group, wherein said cyclic group is cycloalkyl, cycloheteroalkyl, aryl, or heteroaryl, and wherein said cyclic group is optionally substituted by one or more substituents X;

each R is, independently, H, C$_1$–C$_{20}$ alkyl, C$_2$–C$_{20}$ alkenyl, C$_2$–C$_{20}$ alkynyl, C$_1$–C$_{20}$ heteroalkyl, C$_5$–C$_{40}$ aryl, C$_5$–C$_{40}$ heteroaryl, aralkyl; wherein R is optionally substituted by one or more substituents X;

each X is, independently, H, F, Cl, Br, I, R', OR', N(R')$_2$, SR', C(O)R', C(O)OR', C(O)N(R')$_2$, CN, NO$_2$, SO$_2$, SOR', SO$_2$R', or SO$_3$R';

each R' is, independently, H, C$_1$–C$_{20}$ alkyl, C$_1$–C$_{20}$ perhaloalkyl C$_2$–C$_{20}$ alkenyl, C$_2$–C$_{20}$ alkynyl, C$_1$–C$_{20}$ heteroalkyl, C$_5$–C$_{40}$ aryl, or C$_5$–C$_{40}$ heteroaryl;

wherein at least one of $R^1$, $R^2$, $R^3$, $R^4$, $R^9$, $R^{10}$, $R^{11}$, and $R^{12}$ is not H;

and wherein the device has reduced pixel shrinkage.

It is believed that when the substituents $R^1$, $R^2$, $R^3$, $R^4$, $R^9$, $R^{10}$, $R^{11}$, and $R^{12}$ provide sufficient steric bulk or molecular weight, the device shows reduced pixel shrinkage.

In a preferred embodiment of the invention, the compound of the formula VII preferably has one or more substituents. The compound of the formula VII may be monosubstituted, with the substituent occurring in the position of $R^9$ to give a compound of the formula VII$_a$

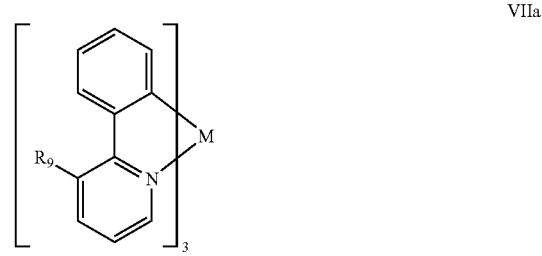

VIIa

In a preferred embodiment for compounds of the formula VII$_a$, $R^9$ is R. Particularly, R is selected from C$_1$–C$_{20}$ alkyl. In a preferred embodiment, R is methyl. In a particularly preferred embodiment, $R^9$ is methyl and M is Ir to give a compound of the formula VII$_b$:

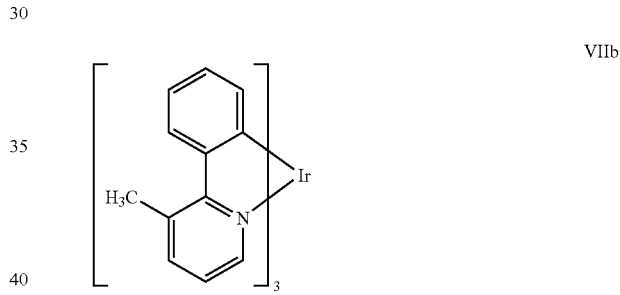

VIIb

In a preferred embodiment of the invention, the emissive material is a compound of the formula VII wherein at least one of $R^1$, $R^2$, $R^3$, $R^4$, $R^9$, $R^{10}$, $R^{11}$, and $R^{12}$ is aryl or heteroaryl.

The compound of the formula VII may be monosubstituted, with the substituent occurring in the position of $R^3$ to give a compound of the formula VIIC

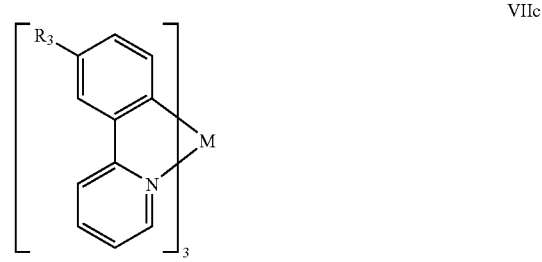

VIIc

In a preferred embodiment for compounds of the formula VIIc, $R^3$ is R. Particularly, R is selected from C$_5$–C$_{40}$ aryl and C$_5$–C$_{40}$ heteroaryl. In a particularly preferred embodiment, R is phenyl to give a compound of the formula VIId:

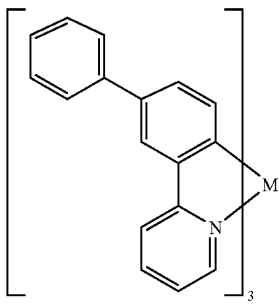

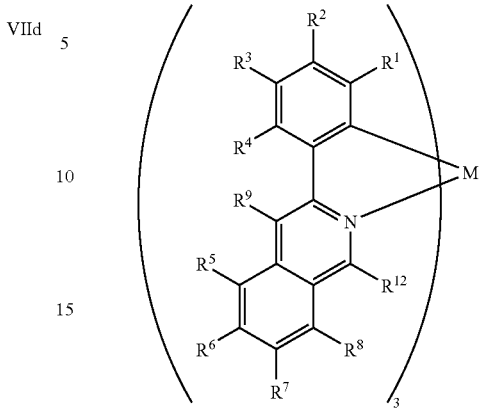

In a preferred embodiment for compounds of the formula VIIc, $R^3$ is R, R is phenyl and M is Ir to give a compound of the formula VIIe

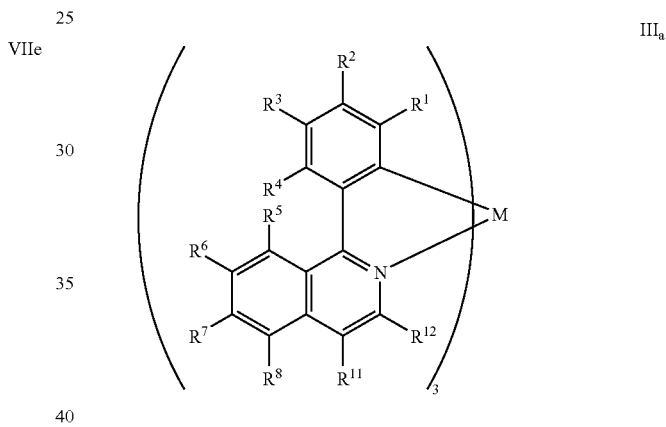

In particularly preferred embodiments of the present invention, the emissive material is a compounds of the formula $I_a$, $II_a$ or $III_a$

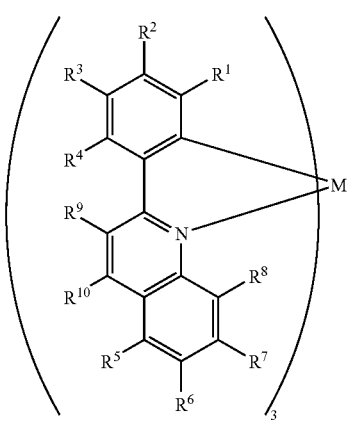

M is a metal atom;

each $R^1$, $R^2$, $R^3$, $R^4$, $R^5$, $R^6$, $R^7$, $R^8$, $R^9$, $R^{10}$, $R^{11}$ and $R^{12}$ is, independently, H, F, Cl, Br, I, R, OR, $N(R)_2$, SR, C(O)R, C(O)OR, C(O)N(R)$_2$, CN, NO$_2$, SO$_2$, SOR, SO$_2$R, SO$_3$R; and additionally, or alternatively, any one or more of $R^1$ and $R^2$, or $R^2$ and $R^3$, or $R^3$ and $R^4$, or $R^5$ and $R^6$, or $R^6$ and $R^7$, or R and $R^8$, or $R^9$ and $R^{10}$, or $R^{11}$ and $R^{12}$, together form, independently, a fused 4- to 7-member cyclic group, wherein said cyclic group is cycloalkyl, cycloheteroalkyl, aryl, or heteroaryl, and wherein said cyclic group is optionally substituted by one or more substituents X;

each R is, independently, H, $C_1$–$C_{20}$ alkyl, $C_2$–$C_{20}$ alkenyl, $C_2$–$C_{20}$ alkynyl, $C_1$–$C_{20}$ heteroalkyl, $C_5$–$C_{40}$ aryl, $C_3$–$C_{40}$ heteroaryl, aralkyl; wherein R is optionally substituted by one or more substituents X;

each X is, independently, H, F, Cl, Br, I, R', OR', N(R')$_2$, SR', C(O)R', C(O)OR', C(O)N(R')$_2$, CN, NO$_2$, SO$_2$, SOR', SO$_2$R', or SO$_3$R'; and each R' is, independently, H, $C_1$–$C_{20}$ alkyl, $C_1$–$C_{20}$ perhaloalkyl $C_2$–$C_{20}$ alkenyl, $C_2$–$C_{20}$ alkynyl, $C_1$–$C_{20}$ heteroalkyl, $C_5$–$C_{40}$ aryl, or $C_5$–$C_{40}$ heteroaryl.

It is intended that the present compounds include any combination or $R^1$, $R^2$, $R^3$, $R^4$, $R^5$, $R^6$, $R^7$, $R^8$, $R^9$, $R^{10}$, $R^{11}$ and $R^{12}$ substituents and fused cyclic groups wherein the resulting pixel shows reduced pixel shrinkage. In a preferred embodiment of the present invention, the organic light emitting device having reduced pixel shrinkage comprises a grid of pixels patterned on an anode, wherein each pixel comprises an emissive layer comprising an emissive material of the formula $I_a$, $II_a$, or $III_a$. In further preferred embodiments the metal, M, is Ir.

In a preferred embodiment of the invention, the emissive material is a compound of the formula $I_a$. The compound of the formula $I_a$ preferably has one or more substituents. The compound of the formula $I_a$ may be monosubstituted, with the substituent occurring in the position of $R^9$ to give a compound of the formula $I_b$

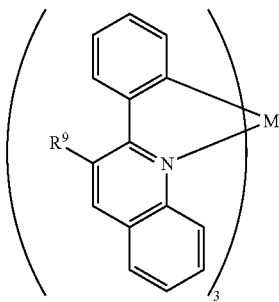

$I_b$ wherein $R^9$ is selected from the group consisting of F, Cl, Br, I, R, OR, $N(R)_2$, SR, C(O)R, C(O)OR, $C(O)N(R)_2$, CN, $NO_2$, $SO_2$, SOR, $SO_2R$, $SO_3R$;

each R is, independently, $C_1$–$C_{20}$ alkyl, $C_2$–$C_{20}$ alkenyl, $C_2$–$C_{20}$ alkynyl, $C_1$–$C_{20}$ heteroalkyl, $C_5$–$C_{40}$ aryl, $C_3$–$C_{40}$ heteroaryl, aralkyl; wherein R is optionally substituted by one or more substituents X;

each X is, independently, H, F, Cl, Br, I, R', OR', $N(R')_2$, SR', C(O)R', C(O)OR', $C(O)N(R')_2$, CN, $NO_2$, $SO_2$, SOR', $SO_2R'$, or $SO_3R'$; and each R' is, independently, H, $C_1$–$C_{20}$ alkyl, $C_1$–$C_{20}$ perhaloalkyl $C_2$–$C_{20}$ alkenyl, $C_2$–$C_{20}$ alkynyl, $C_1$–$C_{20}$ heteroalkyl, $C_5$–$C_{40}$ aryl, or $C_3$–$C_{40}$ heteroaryl.

In a preferred embodiment for compounds of the formula $I_b$, $R^9$ is R. Particularly, R is selected from $C_1$–$C_{20}$ alkyl. In a preferred embodiment, R is methyl. In a particularly preferred embodiment, $R^9$ is methyl and M is Ir to give a compound of the formula $I_c$

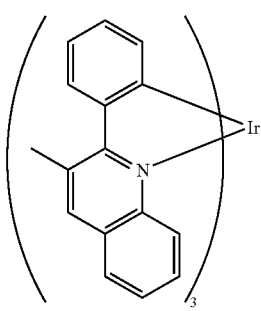

$I_c$

In a preferred embodiment of the invention, the emissive material is a compound of the formula $III_a$. In a particularly preferred embodiment, $R^1$, $R^2$, $R^3$, $R^4$, $R^5$, $R^6$, $R^7$, $R_8$, $R^{11}$ and $R^{12}$ are all H to give a compound of the formula $III_b$

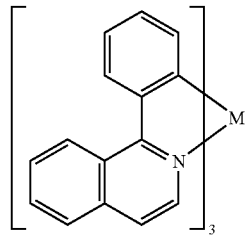

$III_b$

In a particularly preferred embodiment for compounds of the formula $III_b$, $R^1$, $R^2$, $R^3$, $R^4$, $R^5$, $R^6$, $R^7$, $R^8$, $R^{11}$ and $R^{12}$ are all H and M is Ir to give a compound of the formula $III_c$

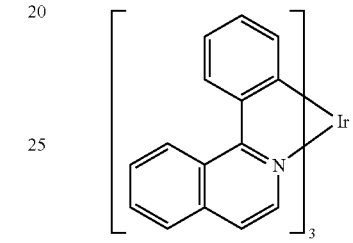

$III_c$

The tris-cyclometallated complexes of the formula VII can be somewhat difficult to prepare due to the steric interaction of the three cyclometallating ligands. The tris-cyclometallated complexes may be synthesized from corresponding bis-cyclometallated acac complex according to the scheme below:

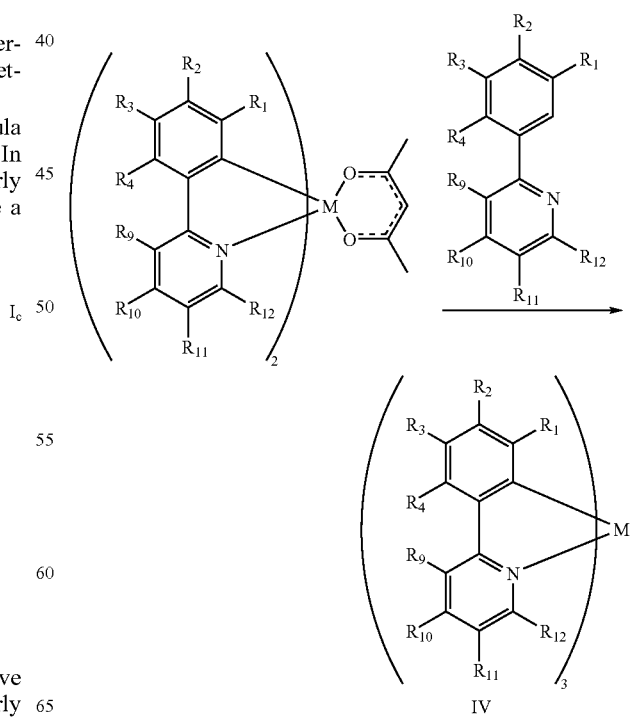

IV wherein $R^1$, $R^2$, $R^3$, $R^4$, $R^9$, $R^{10}$, $R^{11}$, $R^{12}$, and M are as described above for the compound of the formula IV. Additionally, it has been found that there is a temperature dependence for the reaction to occur. The reaction doesn't occur at low temperature (about 20–40° C.) and at high temperature the reaction products or starting materials may decompose. Therefore, there is a ceiling temperature, the value of which is dependent upon the exact identity of the cyclometallating ligand. Table 1 illustrates the ceiling temperature for various tris iridium complexes.

TABLE 1

| compound | ceiling temp. |
| --- | --- |
| 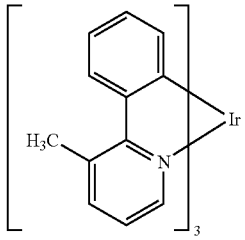<br>(Ir(3-Meppy)₃) | 150° C. |
| 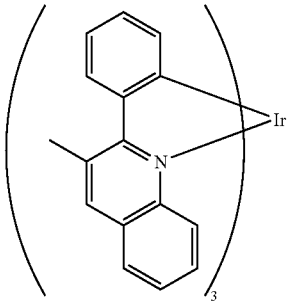<br>Ir(3-Mepq)₃ | 160° C. |
| 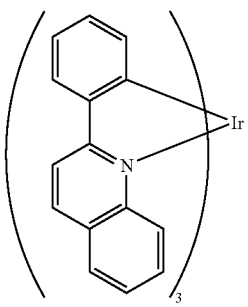<br>Ir(pq)₃ | 220° C. |
| 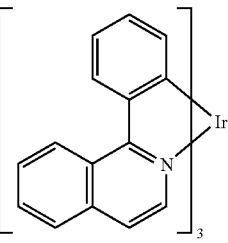<br> | 150° C. |

TABLE 1-continued

| compound | ceiling temp. |
| --- | --- |
| Ir(5'-Mepq)₃ | >150° C. |
| Ir(1-piq)₃ | |

In general the tris compounds have a different emission compared to the corresponding acac counterpart. As the molecular symmetry changes, there is a trend to blue shift seen in the tris compounds relative to the acac counterpart. For example, in an OLED device the tris compound Ir(3-Mepq)₃ has a CIE of (0.65, 0.35), while the acac counterpart Ir(3-Mepq)₂(acac) has a CIE of (0.60, 0.39) and both devices show only dopant emission.

The devices of the present invention The term "halo" or "halogen" as used herein includes fluorine, chlorine, bromine and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted with one or more substituents selected from halo, CN, $CO_2R$, C(O)R, $NR_2$, cyclic-amino, $NO_2$, and OR.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted with one or more substituents selected from halo, CN, $CO_2R$, C(O)R, $NR_2$, cyclic-amino, $NO_2$, and OR.

The term "alkenyl" as used herein contemplates both straight and branched chain alkene radicals. Preferred alkenyl groups are those containing two to fifteen carbon atoms. Additionally, the alkenyl group may be optionally substituted with one or more substituents selected from halo, CN, $CO_2R$, C(O)R, $NR_2$, cyclic-amino, $NO_2$, and OR.

The term "alkynyl" as used herein contemplates both straight and branched chain alkyne radicals. Preferred alkyl groups are those containing two to fifteen carbon atoms. Additionally, the alkynyl group may be optionally substituted with one or more substituents selected from halo, CN, $CO_2R$, C(O)R, $NR_2$, cyclic-amino, $NO_2$, and OR.

The term "aralkyl" as used herein contemplates an alkyl group which has as a substituent an aromatic group. Additionally, the aralkyl group may be optionally substituted on the aryl with one or more substituents selected from halo, CN, $CO_2R$, C(O)R, $NR_2$, cyclic-amino, $NO_2$, and OR.

The term "heterocyclic group" as used herein contemplates non-aromatic cyclic radicals. Preferred heterocyclic groups are those containing 3 or 7 ring atoms which includes at least one hetero atom, and includes cyclic amines such as morpholino, piperdino, pyrrolidino, and the like, and cyclic ethers, such as tetrahydrofuran, tetrahydropyran, and the like.

The term "aryl" or "aromatic group" as used herein contemplates single-ring aromatic groups and polycyclic ring systems. The polycyclic rings may have two or more rings in which two carbons are common by two adjoining rings (the rings are "fused") wherein at least one of the rings is aromatic, e.g., the other rings can be cycloalkyls, cycloalkenyls, aryl, heterocycles and/or heteroaryls.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles and/or heteroaryls.

The term "heteroalkyl" as used herein contemplates substituents that may be represented by the formulas -alkyl-hetero-alkyl, or -hetero-alkyl, wherein hetero is a heteroatom selected from O, S, or NH. Preferred heteroalkyl groups of the formula -alkyl-hetero-alkyl includes ethers, thioethers, and the like. Preferred heteroalkyl groups of the formula -hetero-alkyl includes alkoxy, such as methoxy, ethoxy, butoxy, and the like, and the thio analogs thereof.

Grid materials may be selected from those known in the art. Grid materials may be negative photo-resist materials, such as NR7-250PY (used as a grid in passive matrix displays) and NR7-600PY (used as the integrated shadow mask in passive matrix displays) available from Futurrex Inc. Alternatively, grid materials may be positive photo-resist materials (e.g., polyimide), such as DLDC1000 (used as a grid on various sizes and shapes of test pixels) available from Dow Corning.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

| | |
|---|---|
| CBP: | 4,4'-N,N-dicarbazole-biphenyl |
| m-MTDATA | 4,4',4"-tris(3-methylphenylphenlyamino)triphenylamine |
| Alq$_3$: | 8-tris-hydroxyquinoline aluminum |
| Bphen: | 4,7-diphenyl-1,10-phenanthroline |
| n-BPhen: | n-doped BPhen (doped with lithium) |
| F$_4$-TCNQ: | tetrafluoro-tetracyano-quinodimethane |
| p-MTDATA: | p-doped m-MTDATA (doped with F$_4$-TCNQ) |
| Ir(ppy)$_3$: | tris(2-phenylpyridine)-iridium |
| Ir(ppz)$_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine. |
| ITO: | indium tin oxide |
| NPD: | naphthyl-phenyl-diamine |
| TPD: | N,N'-bis-(3-methylphenyl)-N,N'-bis-(phenyl)-benzidine |

-continued

| | |
|---|---|
| BAlq: | aluminum(III)bis(2-methyl-8-hydroxyquinolinato)4-phenylphenolate |
| mCP: | 1,3-N,N-dicarbazole-benzene |
| DCM: | 4-(dicyanoethylene)-6-(4-dimethylaminostyryl-2-methyl)-4H-pyran |
| DMQA: | N,N'-dimethylquinacridone |
| PEDOT:PSS: | an aqueous dispersion of poly(3,4-ethylenedioxythiophene) with polystyrenesulfonate (PSS) |
| ppz$_2$Ir(dpm): | Iridium(III) bis(1-phenylpyrazolato,N,C2')(2,2,6,6-tetramethyl-3,5-heptanedionato-O,O |

Experimental:

Specific representative embodiments of the invention will now be described, including how such embodiments may be made. Tris-cyclometallated complexes of the formula VII were synthesized according to Examples 1A and 1B (tris quinoline complexes), Examples 2A and 2B (tris-phenylpyridine complexes) and Example 3 (tris isoquinoline complex) and devices were fabricated according to Examples 5–10 and Comparative Examples A, B and C. It is understood that the specific methods, materials, conditions, process parameters, apparatus and the like do not necessarily limit the scope of the invention.

Where available, solvents and reagents were purchased from Aldrich Chemical Company. The reagents were of the highest purity and used as received.

EXAMPLE 1A

Synthesis of Ir(3-Mepq)$_3$ (Iridium(III)tris[2-(3-methyl-2-quinolinyl)-'N)phenyl-'C])

Step 1. Synthesis of 2-(phenyl)-3-methyl-quinoline (Compound 1): 3-methyl-2-chloroquinoline (29.71 g, 167 mmol), phenylboronic acid (24.4 g, 200 mmol), triphenylphosphine (4.388 g, 16.7 mmole) and 2M K$_2$CO$_3$ aqueous soln. (225 mL) were dissolved in the 264 mL of ethylene glycol dimethyl ether. To the stirred solution was added palladium acetate (0.94 g, 4.18 mmole) and the mixture was refluxed under N$_2$ for 20 hours. The reaction mixture was cooled and the water was extracted with methylene chloride three times. The combined organic phase was washed with portions of brine. The organic layer was then dried with anhydrous sodium sulfate, filtered, and evaporated of solvent. The crude material was purified by kegelrohr distillation to give 1 (36.31 g, 98.6%).

Step 2. Synthesis of Iridium(III)di-μ-chlorotetrakis[2-(3-methyl-2-quinolinyl-'N)phenyl-'C] (Compound 2): Compound 1 (36.31 g, 165 mmol) was dissolved in 500 mL of 2-ethoxyethanol. To the stirred solution was added 29.1 g of iridium(III)chloride trihydrate. The mixture was refluxed at 135° C. under N$_2$ for 50 hrs. The solution was cooled down and filtered. The reddish solid was washed with ethanol twice and dried in vacuum to give 2 (32 g, 58%).

Step 3. Synthesis of Iridium(III)bis[2-(3-methyl-2-quinolinyl)-'N)phenyl-'C](2,4-pentanedionato-'O,'O') (Compound 3): Compound 2 (2.78 g) was added to 27 mL of 2-methoxyethanol and to the stirred solution was added 2.09 g of 2,4-pentanedione and 4.43 g of sodium carbonate. The mixture was heated at 100° C. with stirring overnight under N$_2$. The cooled mixture was then filtered to give 3 (2 g, 66%).

Step 4. Synthesis of Iridium(III)tris[2-(3-methyl-2-quinolinyl)-'N)phenyl-'C][Ir(3-Mepq)₃]: Compound 3 (1 g) was added to 20 mL of glycerol and to the stirred solution was added 0.902 g of 2-(phenyl)-3-methyl-quinoline (1). The mixture was heated at 130° C. with stirring for 64 hrs under N₂. The cooled mixture was then filtered to give Ir(3-Mepq)₃) (0.326 g, 28%).

EXAMPLE 1B

Synthesis of [Ir(pq)₃]

(Iridium(III)tris[2-phenyl)-'C(quinolinyl-'N)])

Step 1. Synthesis of Iridium(III)di-µ-chlorotetrakis[2-phenyl)-'C(quinolinyl-'N)](Compound 5): 2-(phenyl)-quinoline (10.0 g, 48.7 mmol) was dissolved in 200 mL of 2-ethoxyethanol and 50 mL of water. To the stirred solution was added (9.03 g, 24.36 mmol) iridium(III)chloride trihydrate. The mixture refluxed at 100° C. under N₂ for 21 hrs. The solution was cooled and filtered. The reddish solid was washed with ethanol twice and dried in vacuum to give 5 (13.5 g, 87.3%).

Step 2. Synthesis of Iridium(III)bis[2-phenyl)-'C(quinolinyl-'N)](2,4-pentanedionato-'O,'O') (Compound 6): Compound 5 (13.5 g 10.62 mmol) from the previous step was added to 200 mL of 2-ethoxyethanol and to the stirred solution was added (10.64 g, 0.106 mol) 2,4-pentanedione and (22.53 g, 0.213 mol) sodium carbonate. The mixture was heated at 120° C. with stirring overnight under N₂. The cooled mixture was then filtered. The collected precipitate was then added to 500 mL of water and stirred for 1 hour. This mixture was then vacuum filtered and washed with methanol to give 6 (13.3 g, 89.4%).

Step 3. Synthesis of Iridium(III)tris[2-phenyl)-'C(quinolinyl-'N)][Ir(pq)₃]: Compound 6 (13.3 g, 19.01 mmol) was added to 400 mL of glycerol and to the stirred solution was added (19.5 g, 0.095 mol) of 2-(phenyl)-quinoline. The mixture was heated at 220° C. with stirring for 48 hrs under N₂. After cooling, 1500 mL of isopropanol alcohol was added and stirred to reduce the viscosity of glycerol. This mixture was then vacuum filtered to give 16 g of crude. The crude was then dried in a vacuum oven. The crude was then ground up using a mortar and pestle and dissolved in methylene chloride. The crude was then purified by a silica gel column chromatography using methylene chloride as the eluent to give the desire product Ir(pq)₃. Yield 3.3 g, 21.5%.

EXAMPLE 2A

Synthesis of [Ir(5-Phppy)₃]

Iridium (III)tris(2-[3-biphenyl]pyridine)

Step 1. Synthesis of 2-(3-biphenyl)pyridine: 3-Bromobiphenyl (3.0 g, 12.9 mmol) 2-tributylstannylpyridine (5.92 g, 16.1 mmol) and dichlorobis(triphenylphosphine) palladium (II) (0.45 g) were refluxed in 75 mL of o-xylene under a stream of N₂ gas for 20 hours. The crude material was then purified on silica gel using 20% EtOAc/Hexanes. The pure fractions were evaporated of solvent to give 2-(3-biphenyl) pyridine (2.90 g, 97.6% yield) as a yellow oil.

Step 2. Synthesis of Iridium(III)tris(2-[3-biphenyl]pyridine): 2-(3-Biphenyl)pyridine (2.90 g, 13.5 mmol) and iridium(III)acetylacetonate (1.24 g, 2.51 mmol) were refluxed in 50 mL of glycerol under a stream of N₂ gas for 48 hours. The mixture was then cooled, enriched with MeCl₂ and extracted twice from brine. The organic layer was dried over anhydrous MgSO₄, filtered and dried on silica. The silica layer was then added to a silica gel column that was prepared with 40% EtOAc/Hexanes. Impurities were removed by elution with 40% EtOAc/Hexanes. After all impurities were removed, the column was flushed with MeCl₂ to obtain the desired product. Evaporation of solvent afforded 1.80 g solid (81.8% yield). Further purification was achieved by dissolving the solid in a minimal amount of MeCl₂ and recrystallizing from Toluene. 1.0 g of this material was successfully sublimed to give [Ir(5-Phppy)₃] (0.43 g).

EXAMPLE 2B

Synthesis of Ir(3-Meppy)₃

Step 1. Synthesis of [Ir(3-Meppy)₂Cl]₂

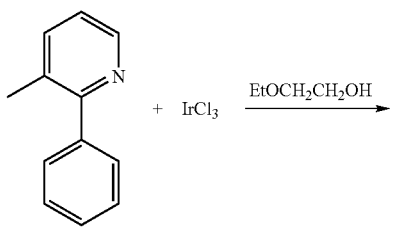

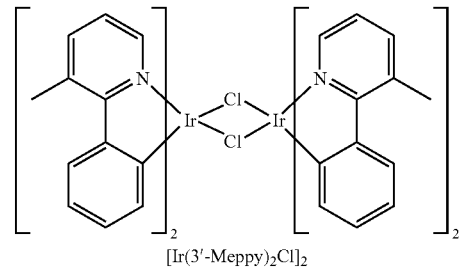

[Ir(3'-Meppy)₂Cl]₂

3-methyl-2-phenylpyridne (15 g, 88.6 mmol, 2 equiv.) was added to 120 mL of 2-ethoxyethanol and 30 mL of water. To the stirred solution was added 16.42 g of IrCl3.4H2O (44.3 mmol, 2 equiv.). Then the reaction was heated at 90° C. with stirring for 25 hrs under N2. The solution was cooled and filtered. The solid was recrystallized from methylene chloride and dried in vacuum to give [Ir(3-Meppy)2Cl]2 (17.3 g, 69%).

Step 2. Synthesis of Ir(3-Meppy)2(acac)

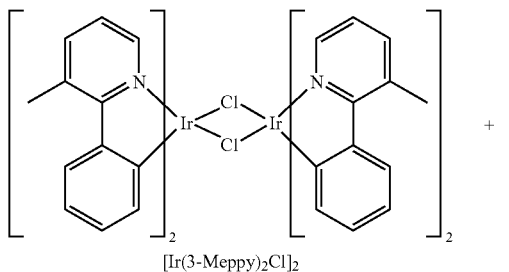

[Ir(3-Meppy)₂Cl]₂

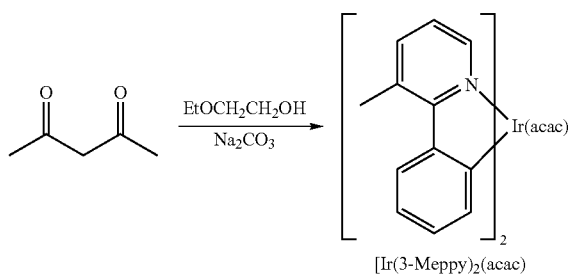

[Ir(3-Meppy)₂(acac)]

[Ir(3-Meppy)₂Cl]₂ (8.4 g 7.44 mmol) from the previous step was added to 84 mL of 2-ethoxyethanol and to the stirred solution was added 2,4-pentanedione (7.45 g, 74.4 mmol) and sodium carbonate(15.77 g, 148.8 mmol). The mixture was heated at 97° C. for 16 hrs under N₂. The cooled mixture was then filtered. The collected precipitate was then added to 500 ml of water and stirred for 1 hour. This mixture was then vacuum filtered and washed with ethanol to give crude Ir(3-Meppy)₂(acac) (8.2 g, 87%) which was used in the next step without further purification.

Step 3. Synthesis of Ir(3-Meppy)₃

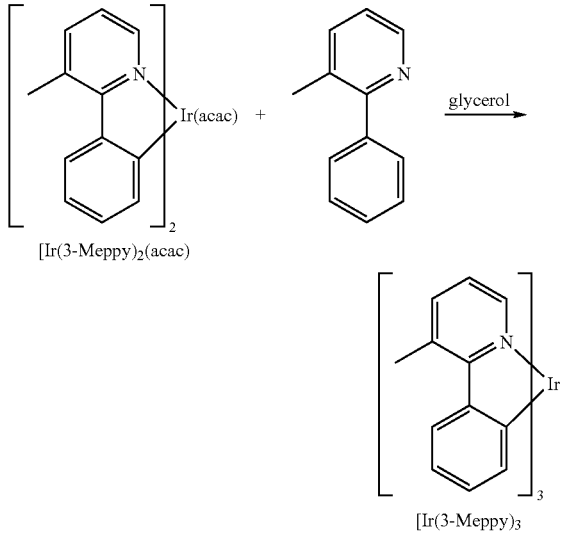

Ir(3-Meppy)₂(acac) (12.34 g 19.6 mmol) from the previous step was added to 493 mL of glycerol and to the stirred solution was added 8.3 g of 3-methyl-2-phenylpyridine (49.1 mmol, 2.5 equiv.). The mixture was purged with nitrogen for 0.5 hr. Then the reaction was heated at 150° C. with stirring for 55 hrs under N₂ purged. At this point, HPLC showed 100% of conversion and reaction was stopped. The cooled mixture was then poured into water (2 L) and stirred for 0.5 hour. Then it was extracted with methylene chloride (250 ml×3). The organic portion was evaporated to dryness and the residue was subjected to Kugelehor distillation to remove the excess ligand (180° C., 500 micro). The residue was passed through silca gel column (CH₂Cl₂) and the product was eluted out as a first component which was further recrystallized from methylene chloride to give 1.83 g of pure Ir(3-Meppy)₃. The product was finally sublimed in vacuum before using in devices.

EXAMPLE 3

Synthesis of Ir(1-piq)₃

Step 1. Synthesis of 1-phenylisoquinoline (1-piq)

2-Chloro-isoquinoline (28.8 g, 0.176 mol), phenylboronic acid (25.7 g 0.211 mol), triphenylphosphine (4.6 g 17.6 mmol), palladium acetate (0.99 g 4.4 mmol) and 2M solution of potassium carbonate (65.7 g 0.475 mol) were added to 270 ml of dimethoxyethane. This mixture was stirred at reflux for 17 hrs. The mixture was then cooled and the aqueous layer was separated from the organic layer. The aqueous extraction was then extracted with ethyl acetate. The combined organic extractions were then extracted with brine and dried over magnesium sulfate. The solvent was then evaporated to give a liquid which was then purified by Kugelhor distillation at 220° C. @1200 microns to yield 35 g (96.9%) of 1-phenylisoquinoline.

Step 2. Synthesis [Ir(1-piq)₂Cl]₂

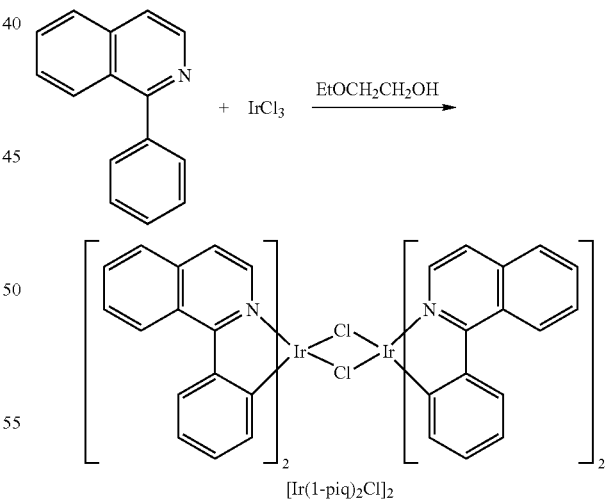

[Ir(1-piq)₂Cl]₂

1-Phenylisoquinoline (15.0 g, 73.01 mmol) was dissolved in 300 mL of 2-ethoxyethanol and 75 ml of water. To the stirred solution was added (13.5 g, 36.5 mmol) iridium(III) chloride trihydrate. The mixture was refluxed at 100° C. under N₂ for 21 hrs. The solution was cooled and filtered. The reddish solid was washed with ethanol, hexanes and dried in vacuum to give [Ir(l-piq)₂Cl]₂ (17.2 g, 74.1%)

Step 3. Synthesis Ir(1-piq)$_2$(acac)

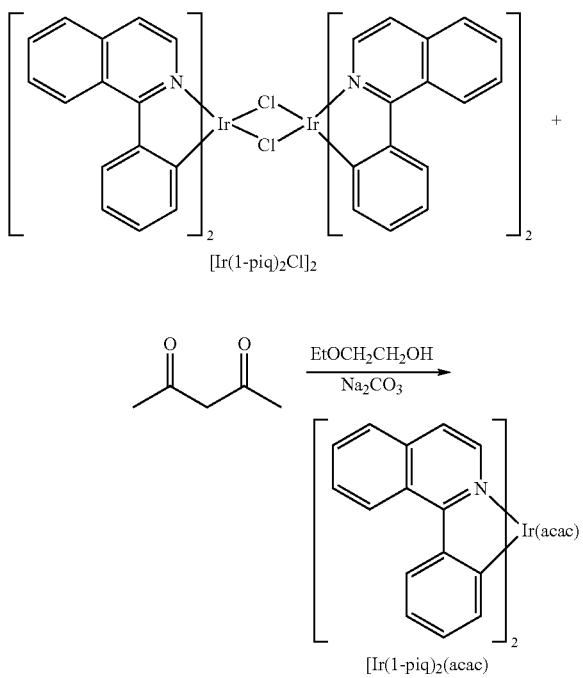

[Ir(1-piq)$_2$Cl]$_2$ (24.1 g 18.9 mmol) was added to 500 mL of 2-ethoxyethanol to the stirred solution was added 2,4-pentanedione (19.0 g, 0.189 mol) and 2M solution of sodium carbonate (40.2 g, 0.379 mol). The mixture was heated at 120° C. with stirring overnight under N$_2$. The cooled mixture was then filtered. The collected precipitate was then added to 1000 mL of water and stirred for 1 hour. This mixture was then vacuum filtered and washed with methanol and hexanes to give Ir(1-piq)$_2$(acac) (14.7 g, 55.0%).

Step 4. Synthesis of Ir(1-piq)$_3$

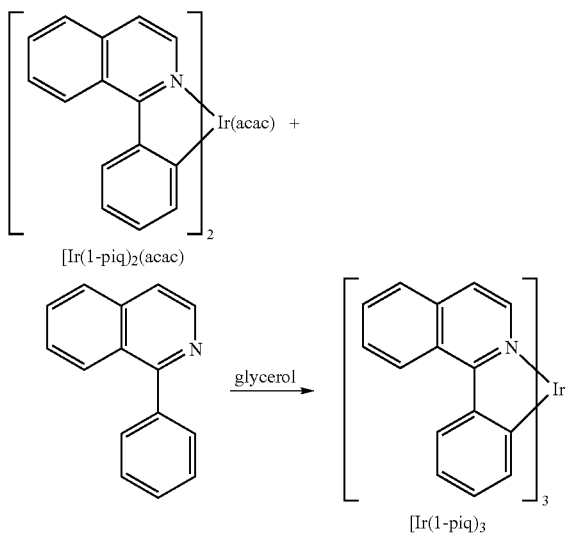

500 mL of glycerol was added to a 1 L reactor and heated at 160° C. for two hours. Ir(1-piq)$_2$(acac) (16.7 g, 23.9 mmol) was added to the glycerol and the mixture was stirred until homogeneous. To this mixture, 1-phenylisoquinoline (14.7 g, 71.6 mmol) was added. The mixture was heated at 160° C. for 72 hours under N$_2$. To the cooled mixture, 1500 mL of D.I. water was added and stirred to reduce the viscosity of glycerol. This mixture was then vacuum filtered to give 19 g of crude product which was then dried in a vacuum oven. The crude product was then ground up using a mortar and pestle and dissolved in methylene chloride followed by silica gel column chromatography (eluent: methylene chloride). The collected fractions were then evaporated to dryness (9.1 g). The product was added to 1100 mL of dichlorobenzene and heated at reflux. The hot mixture was then vacuum filtered. 500 mL of solvent was then removed. Upon cooling 3.6 g of recrystallized product was collected by vacuum filtration. The product was further purified by another recrystallization using dichlorobenzene (1.0 g per 200 mL). The product was finally sublimed in vacuum before using in devices.

EXAMPLE 4

Device Fabrication and Measurement

The devices of Examples 5–7 and comparative examples A–C were fabricated by high vacuum (<10$^{-7}$ Torr) thermal evaporation. Prior to device fabrication, indium tin oxide (ITO) anode on glass, was patterned as 2.24 mm wide stripes (~1200 Å of ITO, sheet resistance ~20 Ω/□). After cleaning, the substrates were dried under an N$_2$ flow followed by UV ozone treatment for 10 min. The cathode consists of 10 Å of LiF followed by 1,000 Å of Al. The OLEDs were formed as 2.24×2.24 mm squares at the intersections of ITO anode and Al cathode stripes. All devices were encapsulated with a glass lid sealed with an epoxy resin in a nitrogen glove box (<1 ppm of H$_2$O and O$_2$) immediately after fabrication, and a moisture getter was incorporated inside the package.

A display brightness level of 100 cd/m$^2$ was used to compare the efficiency between different devices. A constant DC current of 10 mA/cm$^2$ was applied to the pixel for 1000 hours continuously at room temperature. This current density may be used to evaluate devices that are intended for operation at a different current density. If a specific amount of shrinkage occurs at 10 mA/cm$^2$ and 1000 hours, it is expected that a comparable amount of shrinkage will occur when the device is operated at a lower current density for a longer time, or at a higher current density for a shorter time. Devices run at a low current density, for example 0.1 mA/cm$^2$ may experience a certain shrinkage over greater period of time. However, such a device may still be tested at a higher current density, e.g., 10 mA/cm$^2$, in order to determine the amount of shrinkage that occurs at the higher current density after 1000 hours at room temperature. Initially, the entire pixel emits light uniformly. After a period of operation, the pixel may emit non-uniformly, showing a dimmer area at the perimeter of the pixel.

Pixel shrinkage was measured on a pixel with the active area (ITO anode opening) defined by a photoresist grid (polyimide photo-resist grid DLDC1000, available from Dow Corning). The shrinkage, measured as the width of the dim area which extends inward from the edge of the pixel to the area of uniform brightness, was examined and measured using an optical microscope.

TABLE 2

| Example | Dopant | Luminance efficiency (cd/A) at 100 cd/m$^2$ | External quantum efficiency (%) at 100 cd/m$^2$ | CIE | Shrinkage after 1000 hr at 10 mA/cm$^2$ |
|---|---|---|---|---|---|
| 5 | Ir(3-Mepq)$_3$ | 17.7 | 11.2 | 0.60, 0.39 | none |
| 6 | Ir(pq)$_3$ | 28.5 | 12.5 | 0.57, 0.43 | none |
| 7 | Ir(5-Phppy)$_3$ | 29.9 | 8.0 | 0.31, 0.64 | None |
| Comp. Example A | Ir(3-Mepq)$_2$(acac) | 11.0 | 10.0 | 0.65, 0.35 | 9 μm |
| Comp. Example B | Ir(pq)$_2$(acac) | 18.2 | 10.5 | 0.61, 0.38 | 16 μm |
| Comp. Example C | Ir(ppy)$_3$ | 22.3 | 6.2 | 0.30, 0.63 | 40 μm |

In further experiments, the devices of Examples 8–10 were fabricated by high vacuum (>10$^{-7}$ Torr) thermal evaporation. The anode electrode was ~1200 Å of indium tin oxide (ITO). The cathode consisted of 10 Å of LiF followed by 1,000 Å of Al. All devices were encapsulated with a glass lid sealed with an epoxy resin in a nitrogen glove box (<1 ppm of H$_2$O and O$_2$ immediately after fabrication, and a moisture getter was incorporated inside the package. A constant DC current of 40 mA/cm$^2$ was applied continuously at room temperature to the pixels of Examples 8–10.

The current-voltage luminance (IVL) characteristics were measured and are summarized in Table 3. The luminous efficiency at 10 mA/cm$^2$ was used to compare the efficiency between the different devices. FIGS. 4A, 4B, 4C and 4D depict pixel shrinkage for Comparative Example A (Ir(3-Mepq)$_2$(acac) after 300 hours), Example 8 (Ir(1-piq)$_3$ after 1000 hours), Example 9 (Ir(3-Meppy)$_3$ after 260 hours) and Example 10 (Ir(5-Phppy)$_3$ after 289 hours) respectively.

TABLE 3

| Example | Phosphorescent Material | Efficiency (cd/A) at 10 mA/cm$^2$ | Device CIE coordinates |
|---|---|---|---|
| 8 | Ir(1-piq)$_3$ | 8 | 0.67, 0.37 |
| 9 | Ir(2-Meppy)$_3$ | 27 | 0.33, 0.63 |
| 10 | Ir(5-Phppy)$_3$ | 27 | 0.31, 0.64 |

COMPARATIVE EXAMPLE A

Ir(3-Mepq)$_2$(acac) Doped Device

The organic stack consists of 100 Å thick of copper phthalocyanine (CuPc) as the hole injection layer (HIL), 400 Å of 4,4'-bis[N-(1-naphthyl)-N-phenylamino]biphenyl (α-NPD), as the hole transporting layer (HTL), 300 Å of 4,4'-bis(N-carbazolyl)biphenyl (CBP) doped with 12 wt % of Ir(3-Mepq)$_2$acac) as the emissive layer (EML). The ETL2 is 150 Å of aluminum(III)bis(2-methyl-8-quinolinato)4-phenylphenolate (BAlq). The ETL1 is 400 Å of tris(8hydroxyquinolinato)aluminum (Alq$_3$). As shown in Table 2, pixel shrinkage of 9 μm was observed after 1000 hours at a constant DC current of 10 mA/cm$^2$.

COMPARATIVE EXAMPLE B

Ir(pq)2(acac) Doped Device

The organic stack consists of 100 Å thick of copper phthalocyanine (CuPc) as the hole injection layer (HIL), 500 Å of 4,4'-bis[N-(1-naphthyl)-N-phenylamino]biphenyl (α-NPD), as the hole transporting layer (HTL), 300 Å of 4,4'-bis(N-carbazolyl)biphenyl (CBP) doped with 12 wt % of Ir(3-Mepq)$_2$(acac) as the emissive layer (EML). The ETL2 is 150 Å of aluminum(III)bis(2-methyl-8-quinolinato) 4-phenylphenolate (BAlq). The ETL1 is 400 Å of tris(8-hydroxyquinolinato)aluminum (Alq$_3$). As shown in Table 2, pixel shrinkage of 16 μm was observed after 1000 hours at a constant DC current of 10 mA/cm$^2$.

COMPARATIVE EXAMPLE C

Ir(Ppy)$_3$ Doped Device

The organic stack consists of 100 Å thick of copper phthalocyanine (CuPc) as the hole injection layer (HIL), 300 Å of 4,4'-bis[N-(1-naphthyl)-N-phenylamino]biphenyl (α-NPD), as the hole transporting layer (HTL), 300 Å of 4,4'-bis(N-carbazolyl)biphenyl (CBP) doped with 6 wt % of Ir(ppy)$_3$ as the emissive layer (EML). The ETL2 is 100 Å of aluminum(III)bis(2-methyl-8-quinolinato)4-phenylphenolate (BAlq). The ETL1 is 400 Å of tris(8-hydroxyquinolinato)aluminum (Alq$_3$). As shown in Table 2, pixel shrinkage of 40 μm was observed after 1000 hours at a constant DC current of 10 mA/cm$^2$.

EXAMPLE 5

Ir(3-Mepq) Doped Device

The organic stack consists of 100 Å thick of copper phthalocyanine (CuPc) as the hole injection layer (HIL), 450 Å of 4,4'-bis[N-(1-naphthyl)-N-phenylamino]biphenyl (α-NPD), as the hole transporting layer (HTL), 300 Å of 4,4'-bis(N-carbazolyl)biphenyl (CBP) doped with 6 wt % of Ir(3-Mepq)$_3$ as the emissive layer (EML). The ETL2 is 100 Å of aluminum(III)bis(2-methyl-8-quinolinato)4-phenylphenolate (BAlq). The ETL1 is 450 Å of tris(8-hydroxyquinolinato)aluminum (Alq$_3$). As shown in Table 2, no pixel shrinkage was observed after 1000 hours at a constant DC current of 10 mA/cm$^2$.

EXAMPLE 6

Ir(pq)$_3$ Doped Device

The organic stack consists of 100 Å thick of copper phthalocyanine (CuPc) as the hole injection layer (HIL), 500 Å of 4,4'-bis[N-(1-naphthyl)-N-phenylamino]biphenyl (α-NPD), as the hole transporting layer (HTL), 300 Å of 4,4'-bis(N-carbazolyl)biphenyl (CBP) doped with 6 wt % of Ir(pq)$_3$ as the emissive layer (EML). The ETL2 is 150 Å of aluminum(III)bis(2-methyl-8-quinolinato)4-phenylphenolate (BAlq). The ETL1 is 500 Å of tris(8-hydroxyquinolinato)aluminum (Alq$_3$). As shown in Table 2, no pixel shrinkage was observed after 1000 hours at a constant DC current of 10 mA/cm$^2$.

EXAMPLE 7

Ir(5-Phppy)₃ Doped Device

The organic stack consists of 100 Å thick of copper phthalocyanine (CuPc) as the hole injection layer (HIL), 300 Å of 4,4'-bis[N-(1-naphthyl)-N-phenylamino]biphenyl (α-NPD), as the hole transporting layer (HTL), 300 Å of 4,4'-bis(N-carbazolyl)biphenyl (CBP) doped with 4.5 wt % of Ir(5-Phppy)₃ as the emissive layer (EML). The ETL2 is 100 Å of aluminum(III)bis(2-methyl-8-quinolinato)4-phenylphenolate (BAlq). The ETL1 is 400 Å of tris(8-hydroxyquinolinato)aluminum (Alq₃). As shown in Table 2, no pixel shrinkage was observed after 1000 hours at a constant DC current of 10 mA/cm².

EXAMPLE 8

Ir(1-piq)₃ Doped Device

The organic stack consisted of 100 Å thick of copper phthalocyanine (CuPc) as the hole injection layer (HIL), 400 Å of 4,4'-bis[N-(1-naphthyl)-N-phenylamino]biphenyl (α-NPD), as the hole transporting layer (HTL), 300 Å of 4,4'-bis(N-carbazolyl)biphenyl (CBP) doped with 12 wt % of Ir(1-piq)₃ as the emissive layer (EML). The ETL2 is 150 Å of aluminum(III)bis(2-methyl-8-quinolinato)4-phenylphenolate (BAlq). The ETL1 is 400 Å of tris(8-hydroxyquinolinato)aluminum (Alq₃). This device was driven at a constant current of 40 mA/cm² at room temperature for 547 hrs. At this point, the device luminous had degraded to 83.9% of the initial luminance and no pixel shrinkage was observed. As depicted in FIG. 4B, no pixel shrinkage was observed after 1,000 hrs driven at a constant current of 40 mA/cm² at room temperature. In contrast, Comparative Example A (Ir(3-Mepq)₂(acac)) shrank by >14 μm after 300 hrs driven at a constant current of 40 mA/cm² at room temperature (FIG. 4A).

EXAMPLE 9

Ir(3-Meppy)₃ Doped Device

Figure 4C:
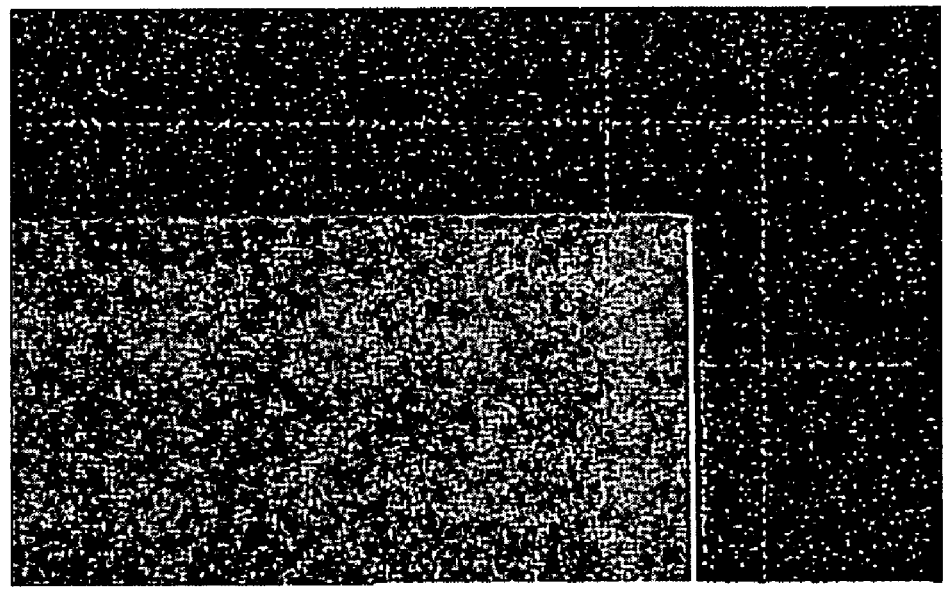
FIG. 4C shows photo results of pixel fill conditions (magnification ×20) for device doped with $Ir(3-Meppy)_3$ under conditions of 40 $mA/cm^2$ dc current at room temperature after 260 hours.

The organic stack consisted of 100 Å thick of copper phthalocyanine (CuPc) as the hole injection layer (HIL), 300 Å of 4,4'-bis[N-(1-naphthyl)-N-phenylamino]biphenyl (α-NPD), as the hole transporting layer (HTL), 300 Å of 4,4'-bis(N-carbazolyl)biphenyl (CBP) doped with 6 wt % of Ir(3-Meppy)₃ as the emissive layer (EML). The ETL2 is 100 Å of aluminum(III)bis(2-methyl-8-quinolinato)4-phenylphenolate (BAlq). The ETL1 is 400 Å of tris(8-hydroxyquinolinato)aluminum (Alq₃). This device was driven at a constant current of 40 mA/cm² at room temperature for 260 hrs. At this point, the device luminous had degraded to 50.2% of the initial luminance and, as depicted in FIG. 4C, no pixel shrinkage was observed.

EXAMPLE 10

Ir(5-Phppy)₃ Doped Device

Figure 4D:
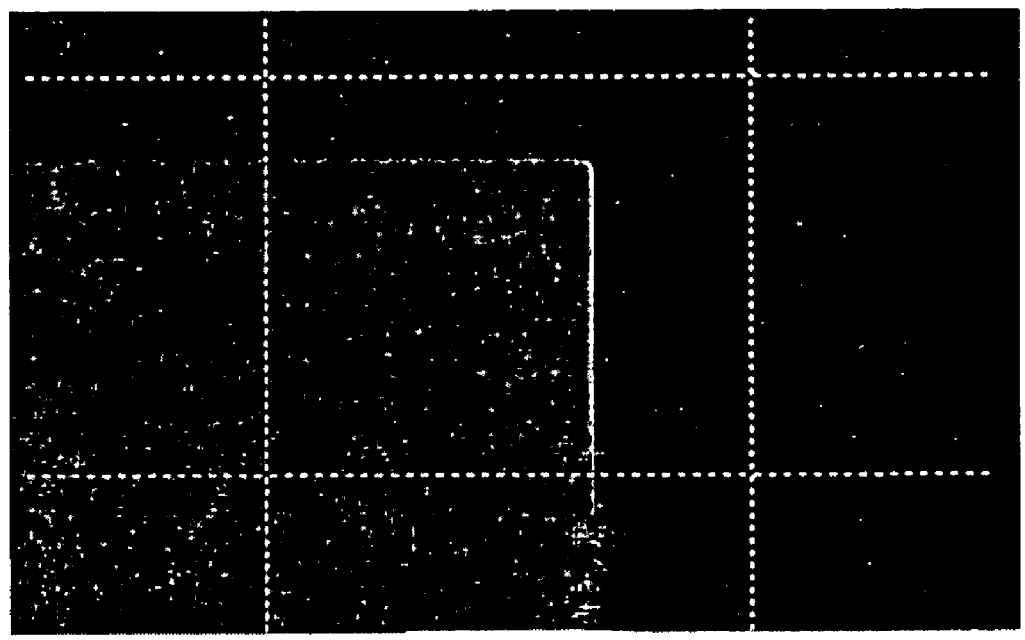
FIG. 4D shows photo results of pixel fill conditions (magnification ×10) for device doped with $Ir(5-Phppy)_3$ under conditions of 40 $mA/cm^2$ dc current at room temperature after 289 hours.

The organic stack consisted of 100 Å thick of copper phthalocyanine (CuPc) as the hole injection layer (HIL), 300 Å of 4,4'-bis[N-(1-naphthyl)-N-phenylamino]biphenyl (α-NPD), as the hole transporting layer (HTL), 300 Å of 4,4'-bis(N-carbazolyl)biphenyl (CBP) doped with 4.5% of Ir(5-Phppy)₃ as the emissive layer (EML). The ETL2 is 100 Å of aluminum(III)bis(2-methyl-8-quinolinato)4-phenylphenolate (BAlq). The ETL1 is 400 Å of tris(8-hydroxyquinolinato)aluminum (Alq₃). This device was driven at a constant current of 40 mA/cm² at room temperature for 289 hrs. At this point the device luminous had degraded to 55.4% of the initial luminance and, as depicted in FIG. 4D, no pixel shrinkage was observed.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device comprising an array of pixels defined by a photoresist grid and having a pixel pitch of less than 500 μm, wherein each pixel comprises an emissive layer comprising a phosphorescent emissive material of the formula

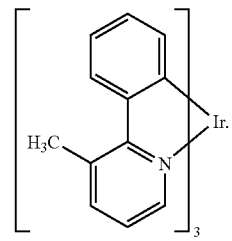

2. An organic light emitting device comprising an array of pixels defined by a photoresist grid and having a pixel pitch of less than 500 μm, wherein each pixel comprises an emissive layer comprising a phosphorescent emissive material of the formula

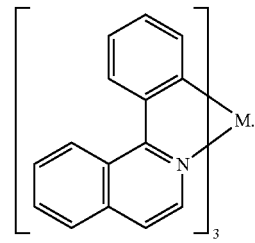

3. The organic light emitting device of claim 2, wherein M is Ir.

* * * * *